(12) United States Patent  
Chen et al.

(10) Patent No.: US 12,396,162 B2
(45) Date of Patent: Aug. 19, 2025

(54) SEMICONDUCTOR DEVICE WITH PROGRAMABLE FEATURE

(71) Applicant: NANYA TECHNOLOGY CORPORATION, New Taipei (TW)

(72) Inventors: Yin-Fa Chen, New Taipei (TW); Jui-Hsiu Jao, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 727 days.

(21) Appl. No.: 17/825,058

(22) Filed: May 26, 2022

(65) Prior Publication Data

US 2023/0389302 A1 Nov. 30, 2023

(51) Int. Cl.
*H10B 12/00* (2023.01)

(52) U.S. Cl.
CPC ......... *H10B 12/50* (2023.02); *H10B 12/0335* (2023.02); *H10B 12/053* (2023.02); *H10B 12/09* (2023.02); *H10B 12/315* (2023.02); *H10B 12/34* (2023.02); *H10B 12/482* (2023.02); *H10B 12/485* (2023.02)

(58) Field of Classification Search
CPC .. H10B 12/0335; H10B 12/053; H10B 12/09; H10B 12/315; H10B 12/50; H10D 1/47
See application file for complete search history.

(56) References Cited

U.S. PATENT DOCUMENTS

| | | |
|---|---|---|
| 2002/0014648 A1 | 2/2002 | Mizutani et al. |
| 2004/0053463 A1 | 3/2004 | Matsumura |
| 2004/0152243 A1 | 8/2004 | Kuroda et al. |
| 2004/0173836 A1 | 9/2004 | Oh et al. |
| 2013/0256769 A1* | 10/2013 | Jeong ............... H10B 12/31 257/296 |
| 2015/0102395 A1 | 4/2015 | Park et al. |
| 2019/0386010 A1 | 12/2019 | Tomoyama |
| 2020/0161294 A1 | 5/2020 | Lee et al. |
| 2020/0279594 A1 | 9/2020 | Liu |

FOREIGN PATENT DOCUMENTS

| | | |
|---|---|---|
| CN | 108155189 A | 6/2018 |
| JP | H09275193 A | 10/1997 |
| JP | 2008147484 A | 6/2008 |

(Continued)

OTHER PUBLICATIONS

Office Action and Search Report mailed on Apr. 8, 2024 related to U.S. Appl. No. 17/825,252.

(Continued)

*Primary Examiner* — Meiya Li
(74) *Attorney, Agent, or Firm* — Xuan Zhang

(57) ABSTRACT

The present application provides a semiconductor device with a programmable feature. The semiconductor device includes a substrate, a conductive line, a conductive feature and a plurality of memory cells. The substrate includes a first island, a second island and an isolation structure, wherein the isolation structure is disposed between the first island and the second island. The first island has a first area, and the second island has a second area greater than the first area. The conductive line is disposed over the substrate. The conductive feature connects the conductive line to the second island. The plurality of memory cells are disposed in or on the first island.

15 Claims, 26 Drawing Sheets

(56) References Cited

FOREIGN PATENT DOCUMENTS

| JP | 2009170637 A | 7/2009 |
|---|---|---|
| TW | 202220173 A | 5/2022 |

OTHER PUBLICATIONS

Office Action and Search Report mailed on Aug. 17, 2023 related to U.S. Appl. No. 17/825,252.
Office Action and Search Report mailed on Oct. 19, 2023 related to U.S. Appl. No. 17/825,252.
Office Action and Search Report mailed on Feb. 1, 2024 related to U.S. Appl. No. 17/825,252.
Translation of JPH09275193.

\* cited by examiner

SEMICONDUCTOR DEVICE WITH PROGRAMABLE FEATURE

TECHNICAL FIELD

The present disclosure relates to a semiconductor device, and more particularly, to a semiconductor storage device including a resistive circuit formed in a cell region of a substrate and providing a programmable resistor to a peripheral circuit of the semiconductor storage device in a peripheral region of the substrate.

DISCUSSION OF THE BACKGROUND

Generally, integrated circuits are mass-produced by forming many identical circuit patterns on a single silicon wafer. Integrated circuits, also commonly referred to as semiconductor devices, are made of various materials that may be electrically conductive, electrically nonconductive (insulators) or electrically semiconductive.

Random-access memory devices, such as dynamic random-access memories (DRAMs), include memory cells for storing data and peripheral circuits for switching signals to and from the memory cells. In general, the memory cells are formed in a cell region of a substrate, and the peripheral circuits are formed in a peripheral region laterally enclosing the cell region. The cell region includes multiple active islands for the formation of the memory cells. However, the active islands at a periphery of the cell region may have incomplete profiles, so that no elements are formed in the periphery of the cell region.

This Discussion of the Background section is provided for background information only. The statements in this Discussion of the Background are not an admission that the subject matter disclosed in this Discussion of the Background section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device. The semiconductor device includes a substrate, an access transistor, a storage capacitor, a storage node contact, a conductive line and a conductive feature. The substrate includes a first island, a second island and an isolation structure disposed between the first island and the second island, wherein the first island has a first area, and the second island has a second area greater than the first area. The access transistor is disposed in or on the first island. The storage capacitor is disposed over the access transistor. The storage node contact connects the storage capacitor to the access transistor. The conductive line is disposed over the substrate. The conductive feature connects the conductive line to the second island, and the conductive feature and the storage node contact are disposed at a same horizontal level.

In some embodiments, the second island is closer to a periphery of the substrate than the first island.

In some embodiments, the second area is at least two times larger than the first area.

In some embodiments, the storage capacitor includes a lower electrode, a capacitor insulator and an upper electrode. The lower electrode is in contact with the storage node contact, and the lower electrode and the conductive line are disposed at a same horizontal level. The capacitor insulator is disposed over the lower electrode, and the upper electrode is disposed over the capacitor insulator.

In some embodiments, the first island has a first longitudinal axis, and the second island has a second longitudinal axis parallel to the first longitudinal axis.

In some embodiments, the conductive line extends along the first longitudinal axis.

In some embodiments, the conductive line extends in a first direction that intersects the first longitudinal axis at an angle less than 90 degrees.

In some embodiments, the semiconductor device further includes a bitline and a bitline contact; the bitline is disposed over the substrate, and the bitline contact connects the access transistor to the bitline. The conductive line and the bitline extend in a same direction.

In some embodiments, the access transistor comprises a word line disposed in the substrate, and the conductive line and the word line extend in a same direction.

In some embodiments, the semiconductor device further includes an insulative layer disposed between the access transistor and the storage capacitor and between the conductive line and the second island.

In some embodiments, the storage node contact penetrates through the insulative layer.

In some embodiments, the substrate comprises an active zone and a dummy zone adjacent to the active zone, the first island is located in the active zone, and the second island is located in the dummy zone.

In some embodiments, the semiconductor device further includes a plurality of peripheral circuits located in a peripheral region of the substrate, wherein the dummy zone is located between the active zone and the peripheral region, and the second island functionally acts as a programmable resistor and is electrically coupled to at least one of the peripheral circuits through the conductive feature and the conductive line.

One aspect of the present disclosure provides a semiconductor device. The semiconductor device includes a semiconductor wafer, a memory cell, a peripheral circuit and a resistive circuit. The semiconductor wafer includes a cell region and a peripheral region adjacent to the cell region, and the cell region comprises an active zone and a dummy zone adjacent to the active zone. The dummy zone is located between the active zone and the peripheral region. The memory cell is located in the active zone and comprises an access transistor, a storage capacitor and a storage node contact. The access transistor is disposed in or on the semiconductor wafer, the storage capacitor is disposed over the access transistor, and the storage node contact connects the storage capacitor to the access transistor. The peripheral circuit is located in the peripheral region, and the resistive circuit is located in the dummy zone. The resistive circuit includes a conductive feature in contact with the semiconductor wafer, wherein the storage node contact and the conductive feature are located at a same horizontal level over the semiconductor wafer.

In some embodiments, the semiconductor device further includes an isolation structure disposed in the semiconductor wafer to define a first island in the active zone and a second island in the dummy zone, wherein the first island has a first area, and the second island has a second area greater than the first area.

In some embodiments, the resistive circuit including the second island and the conductive feature is electrically connected to the peripheral circuit through a conductive line disposed over the semiconductor wafer.

In some embodiments, the conductive line extends in a first direction, and the first island and the second island extend in a second direction different from the first direction.

In some embodiments, the semiconductor device further includes a bitline extending parallel to the conductive line and configured to electrically connect the access transistor to the peripheral circuit.

One aspect of the present disclosure provides a method of manufacturing a semiconductor device. The method includes steps of forming a substrate comprising a first island and a second island, wherein the first island has a first area, and the second island has a second area greater than the first area; depositing an insulative layer to cover the substrate; forming a storage node contact and a conductive feature penetrating through the insulative layer, wherein the storage node contact is in contact with the first island and the conductive feature is in contact with the second island; and forming a conductive line on the insulative layer and connected to the conductive feature.

In some embodiments, the formation of the conductive feature and the storage node contact includes steps of performing an etching process to remove portions of the insulative layer exposed through a pattern mask on the insulative layer to thereby form a plurality of openings to expose portions of the first and second islands; and depositing a conductive material in the plurality of openings.

In some embodiments, the method further includes steps of forming a lower electrode on the insulative layer and in contact with the storage node contact; depositing a capacitor insulator to cover the lower electrode; and depositing an upper electrode on the capacitor insulator. The conductive line and the lower electrode are formed simultaneously.

In some embodiments, the formation of the substrate includes steps of providing a semiconductor wafer comprising a cell region and a peripheral region adjacent to the cell region; forming a plurality of first trenches in the semiconductor wafer in the cell region, wherein the plurality of first trenches extend in a first direction; forming a plurality of second trenches in the semiconductor wafer in an active zone of the cell region, wherein the plurality of second trenches extend in a second direction intersecting the first direction; and depositing an isolation material in the plurality of first trenches and the plurality of second trenches.

In some embodiments, the method further includes steps of forming a third trench in the semiconductor wafer in a dummy zone of the cell region prior to the deposition of the isolation material, wherein the third trench extends in the second direction; and depositing the isolation material in the third trench.

In some embodiments, the third trench is connected to one of the plurality of second trenches.

In some embodiments, the plurality of second trenches and the third trench are formed simultaneously, and the deposition of the isolation material in the third trench and the deposition of the isolation material in the plurality of first trenches and the plurality of second trenches are performed simultaneously.

In some embodiments, the method further includes a step of performing a planarization process to remove the isolation material above an upper surface of the semiconductor wafer.

In some embodiments, the dummy zone is at or adjacent to a periphery of the active zone.

In some embodiments, the method further includes steps of forming an access transistor comprising a first impurity region and a second impurity region in the first island prior to the deposition of the insulative layer, wherein the storage node contact contacts the second impurity region; forming a bitline contact in contact with the first impurity region; and forming a bitline connected to the bitline contact.

In some embodiments, the bitline contact and the bitline are formed prior to the formation of the storage node contact.

In some embodiments, the conductive line is formed prior to the formation of the bitline contact.

With the above-mentioned configurations of the semiconductor device, a periphery of the cell region, which is not being used, is reserved for subsequent formation of one or more programmable resistors of the peripheral circuit, and a resistive circuit comprising the programmable resistors is formed simultaneously with formation of first islands where memory cells are disposed, formation of storage node contact and formation of a low electrode of the storage capacitor to thereby minimize a number of processing steps necessary for fabrication of the entire device.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
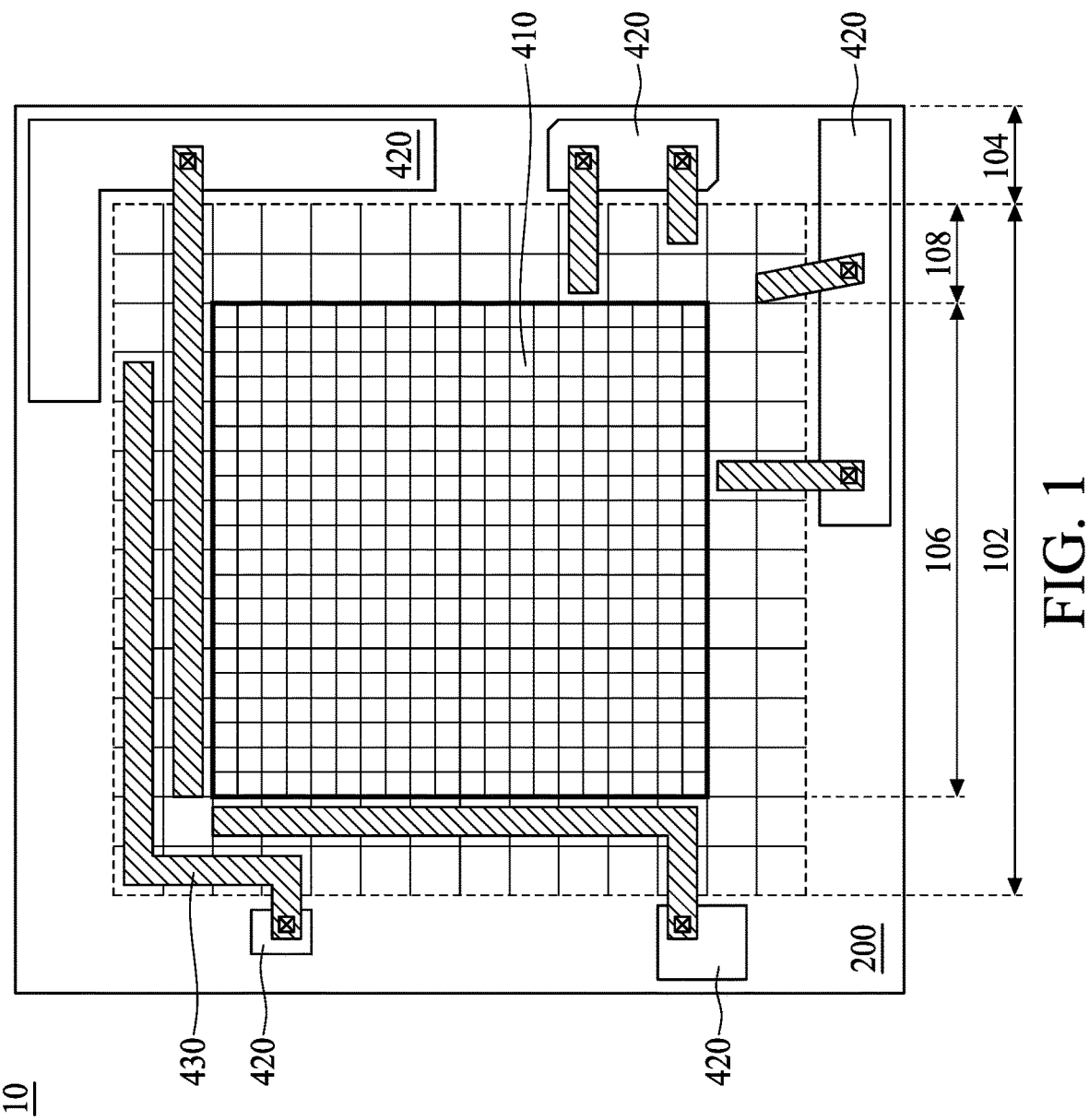
FIG. 1 is a plan view of a semiconductor device in accordance with some embodiments of the present disclosure.

Embodiments, or examples, of the disclosure illustrated in the drawings are described below using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a plan view of a semiconductor device 10 in accordance with some embodiments of the present disclosure. Referring to FIG. 1, the semiconductor device 10 is a semiconductor storage device and includes a memory cell array 410, a plurality of peripheral circuits 420 electrically coupled to the memory cell array 410 for controlling operations of the memory cell array 410, and a resistive circuit 430 electrically coupled to at least one of the peripheral circuits 420. As illustrated in FIG. 1, the memory cell array 410 and the resistive circuit 430 are provided in a cell region 102 of the semiconductor device 10, and the peripheral circuits 420 are provided in a peripheral region 104 adjacent to the cell region 102. More particularly, the memory cell array 410 is provided in an active zone 106 at a center part of the cell region 102, and the resistive circuit 430 is located in a dummy zone 108 between the active zone 106 and the peripheral region 104.

Figure 2:
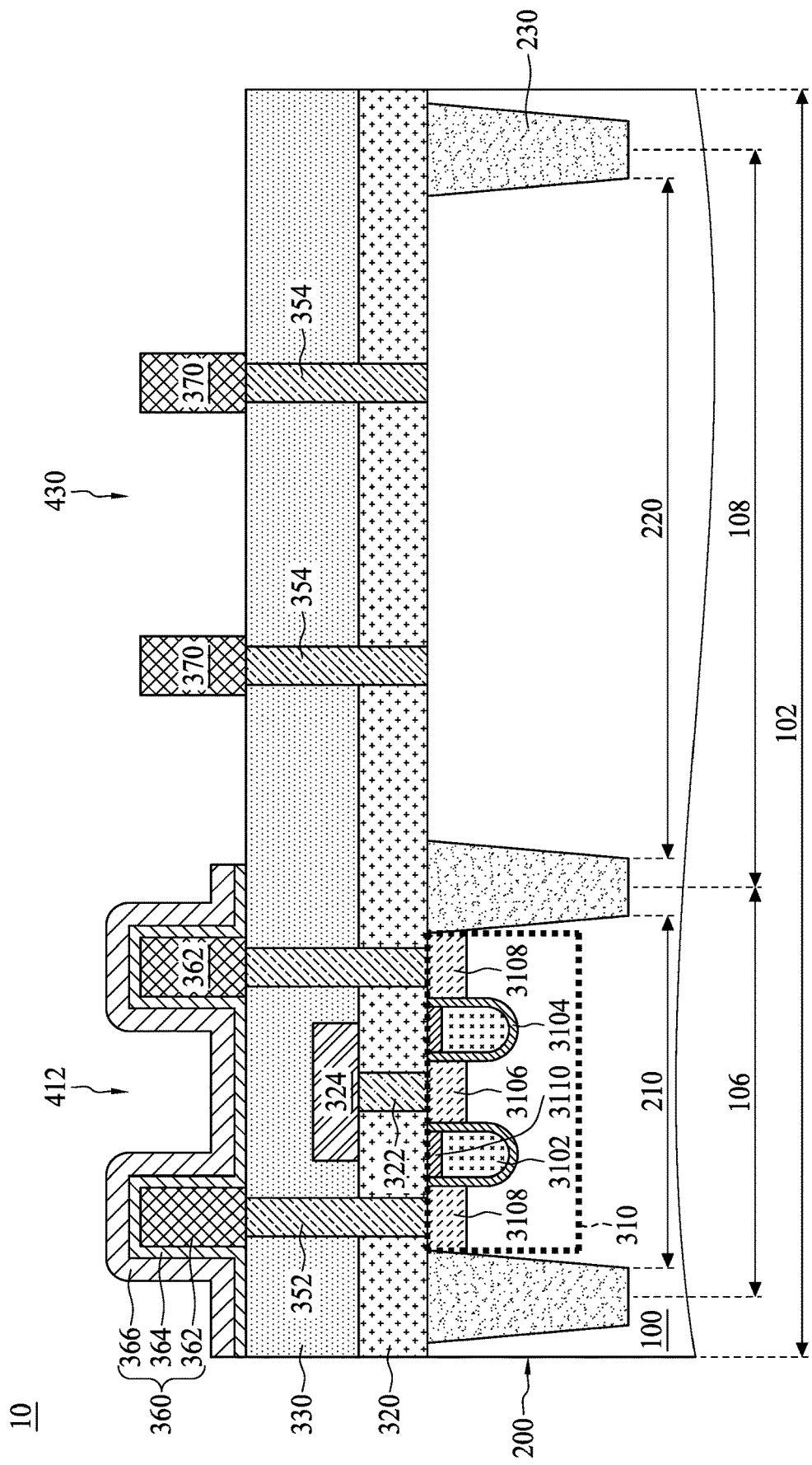
FIG. 2 is a cross-sectional view of the semiconductor device in accordance with some embodiments of the present disclosure.
Figure 3:
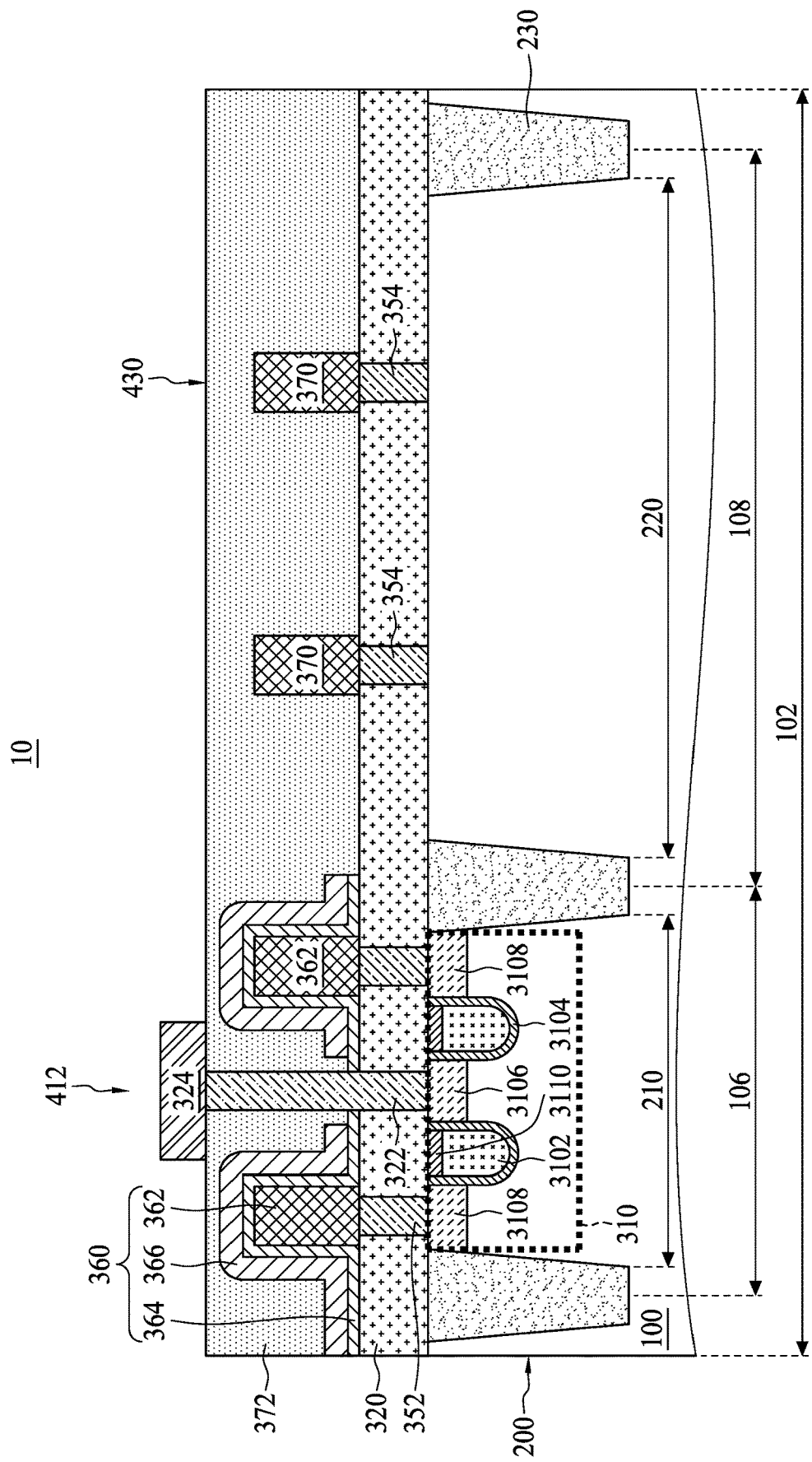
FIG. 3 is a cross-sectional view of the semiconductor device in accordance with some embodiments of the present disclosure.

FIGS. 2 and 3 are cross-sectional views of the semiconductor device 10 in accordance with some embodiments of the present disclosure. Referring to FIGS. 2 and 3, the semiconductor device 10 further includes a substrate 200 where the memory cell array 410, the peripheral circuits 420 and the resistive circuit 430 are disposed. The substrate 200 includes a semiconductor wafer 100 and an isolation structure 230, wherein the isolation structure 230 is disposed in the semiconductor wafer 100 to define a first island 210 in the active zone 106 and a second island 220 in the dummy zone 108. The first island 210 has a first area, and the second island 220 has a second area greater than the first area. Referring to FIGS. 1 to 3, due to the dummy zone 108 laterally encloses the active zone 106, the second island 220 in the dummy zone 108 is closer to periphery of the substrate 200 than the first island 210.

The resistive circuit 430 includes the second island 220 that functionally acts a programmable resistor for the peripheral circuits 420 and one or more conductive features 354 disposed on the second island 220. The resistive circuit 430 may be connected to the peripheral circuits 420 through one or more conductive lines 370.

The memory cell array 410 includes a plurality of memory cells 412 arranged in rows and columns. Each of the memory cells 412 includes an access transistor 310 and a storage capacitor 360, and the storage capacitor 360 is electrically coupled to the access transistor 310 through a storage node contact 352. The conductive feature 354 of the resistive circuit 430 and the storage node contact 352 are located at a same horizontal level.

The access transistor 310 is electrically coupled to at least one of the peripheral circuits 420 through a bitline 324. The semiconductor device 10 can have a capacitor over bitline (COB) structure in which the bitline 324 is located below the storage capacitor 360 (as shown in FIG. 2) or a capacitor under bitline (CUB) structure in which the bitline 324 is located above the storage capacitor 360 (as shown in FIG. 3).

In FIG. 2, the conductive feature 354 and the storage node contact 352 are electrically isolated from each other by a first insulative layer 320 and a second insulative layer 330 stacked on the first insulative layer 320. The bitline 324 on the first insulative layer 320 and buried by the second insulative layer 330 is electrically connected to the access transistor 410 through a bitline contact 322 surrounded by the first insulative layer 320. In FIG. 3, the conductive feature 354 and the storage node contact 352 are electrically isolated from each other by the first insulative layer 320. In addition, the bitline 324 is disposed on a dielectric layer 372 covering the storage capacitor 360, and a bitline contact 322 penetrates through the dielectric layer 372 and the first insulative layer 352 to connect the bitline 324 to the access transistor 310.

The storage capacitor 360 includes a lower electrode 362, a capacitor insulator 364 and an upper electrode 366; the lower electrode 362 is in contact with the storage node contact 352, the capacitor insulator 364 is disposed over the lower electrode 362, and the upper electrode 366 is disposed on the capacitor insulator 364. Notably, the conductive line 370 and the lower electrode 362 are at a same horizontal level.

The access transistor 310 is a recessed access device (RAD) transistor that includes a plurality of word lines 3102 disposed in the substrate 200 and covered by a passivation layer 3110, a plurality of gate insulators 3104 disposed between the substrate 200 and the word lines 3102, and a first impurity region 3106 and a plurality of second impurity regions 3108 disposed between sides of the word lines 3102. The first impurity region 3106 and the second impurity regions 3108 serve as drain and source regions of the access transistors 310. The first impurity region 3106 of the access transistor 310 is electrically coupled to the bitline 324 by the bitline contact 322, while the second impurity regions 3108 of the access transistor 310 are in contact with the storage node contacts 352.

Figure 4:
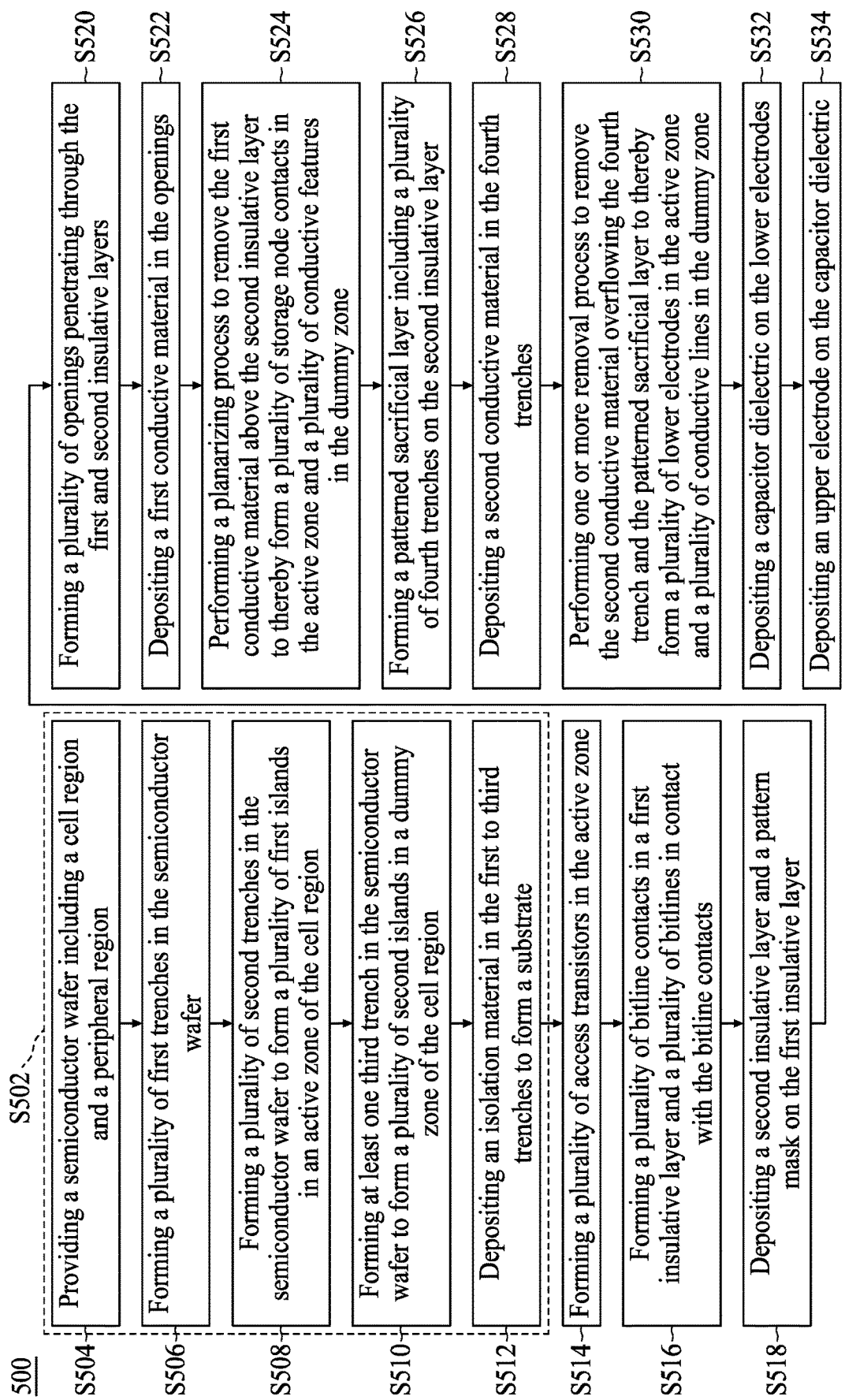
FIG. 4 is a flow diagram illustrating a method of fabricating a substrate of a semiconductor device in accordance with some embodiments of the present disclosure.

FIG. 4 is a flow diagram illustrating a method 500 of fabricating a semiconductor device in accordance with some embodiments of the present disclosure, and FIGS. 5 to 26 illustrate intermediate stages in the formation of the semiconductor device in accordance with some embodiments of the present disclosure. The stages shown in FIGS. 5 to 26 are referred to in the flow diagram in FIG. 4. In the following discussion, the fabrication stages shown in FIGS. 5 to 26 are discussed in reference to the process steps shown in FIG. 4.

The method 500 begins at step S502, in which a substrate 200 including a first island 210 and a second island 220 is formed. The substrate 200 can be formed by steps S504, S506, S508, S510 and S512.

Figure 5:
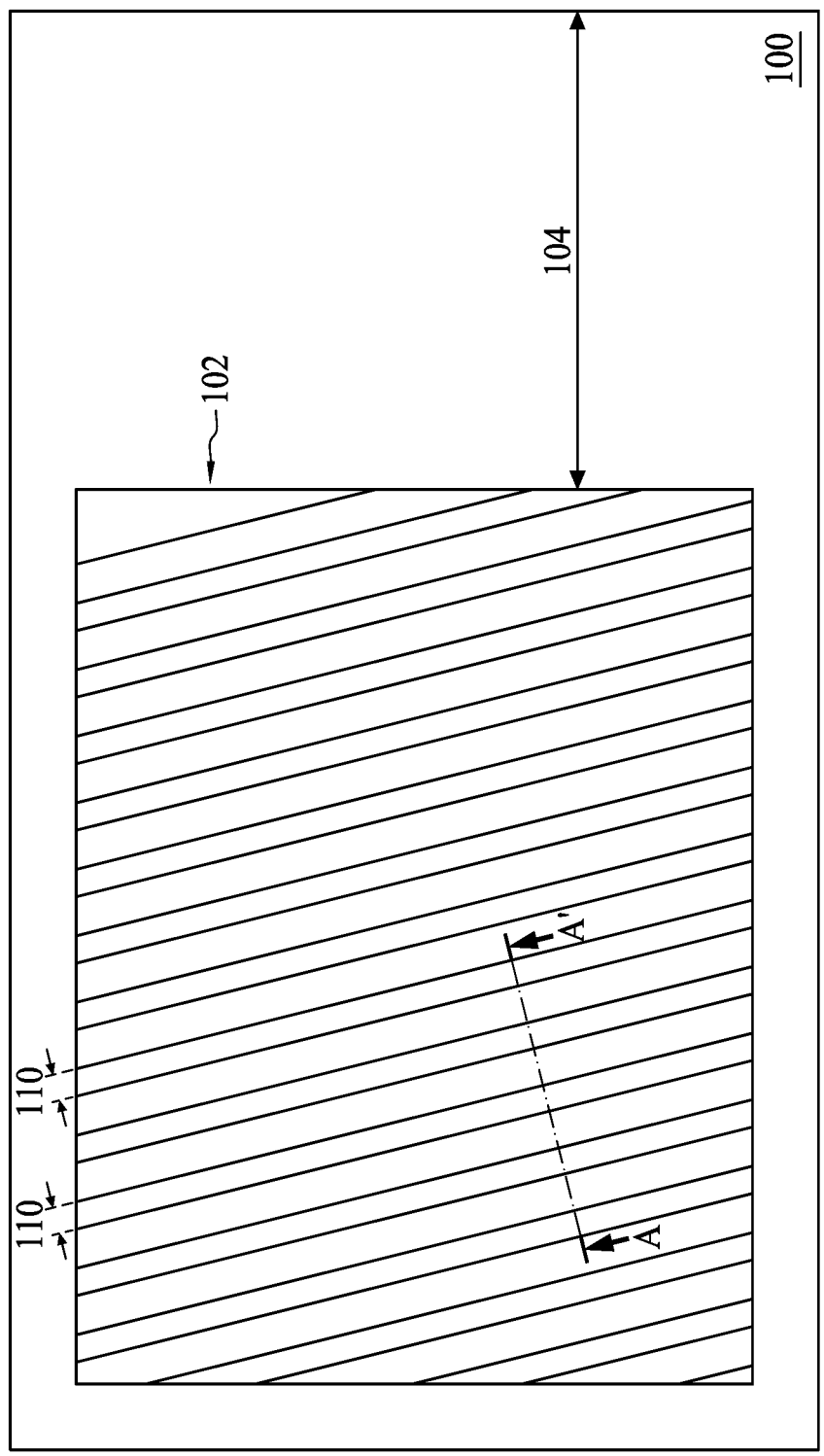
FIG. 5 is a plan view of an intermediate stage in the formation of a semiconductor device in accordance with some embodiments of the present disclosure.
Figure 6:
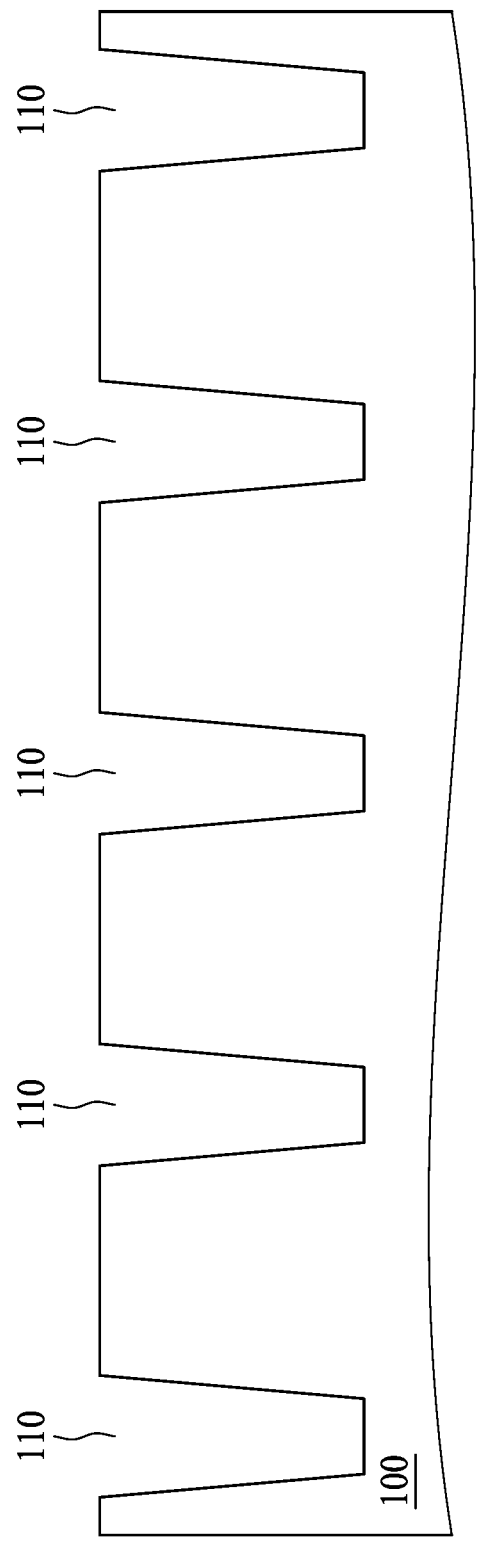
FIG. 6 is a cross-sectional view taken along a line A-A' in FIG. 5.

Referring to FIGS. 5 and 6, a semiconductor wafer 100 including a cell region 102 and a peripheral region 104 is provided according to step S504. In some embodiments, the semiconductor wafer 100 may include monocrystalline silicon, while in other embodiments, the semiconductor wafer 100 may include other materials including, for example, germanium, silicon-germanium, or the like. The peripheral region 104 is adjacent to the cell region 102. In some embodiments, the peripheral region 104 laterally encloses the cell region 102.

Next, a plurality of first trenches 110 are formed in the semiconductor wafer 100 according to step S506 in FIG. 4. The first trenches 110 extend in a first direction D1, and are formed in the cell region 102. The first trenches 110 may be formed by etching the semiconductor wafer 100 using a first trench pattern as a mask. The semiconductor wafer 100 may be etched using a reactive-ion etching (RIE) process, for example. The first trench pattern for the etching of the semiconductor wafer 100 may be formed using a double patterning technology (DPT) or a quadruple patterning technology (QPT) process.

Figure 7:
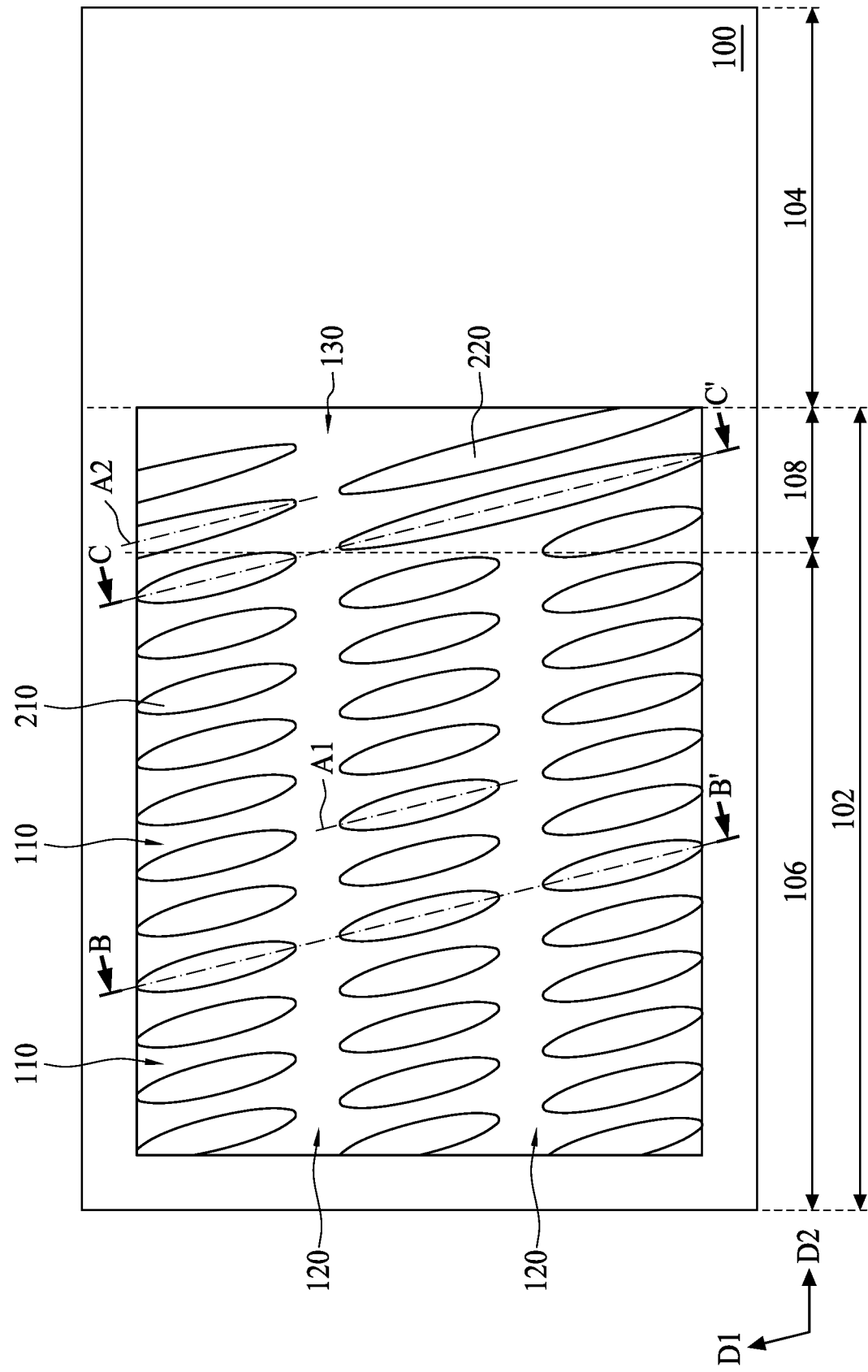
FIG. 7 is a plan view of an intermediate stage in the formation of the semiconductor device in accordance with some embodiments of the present disclosure.
Figure 8:
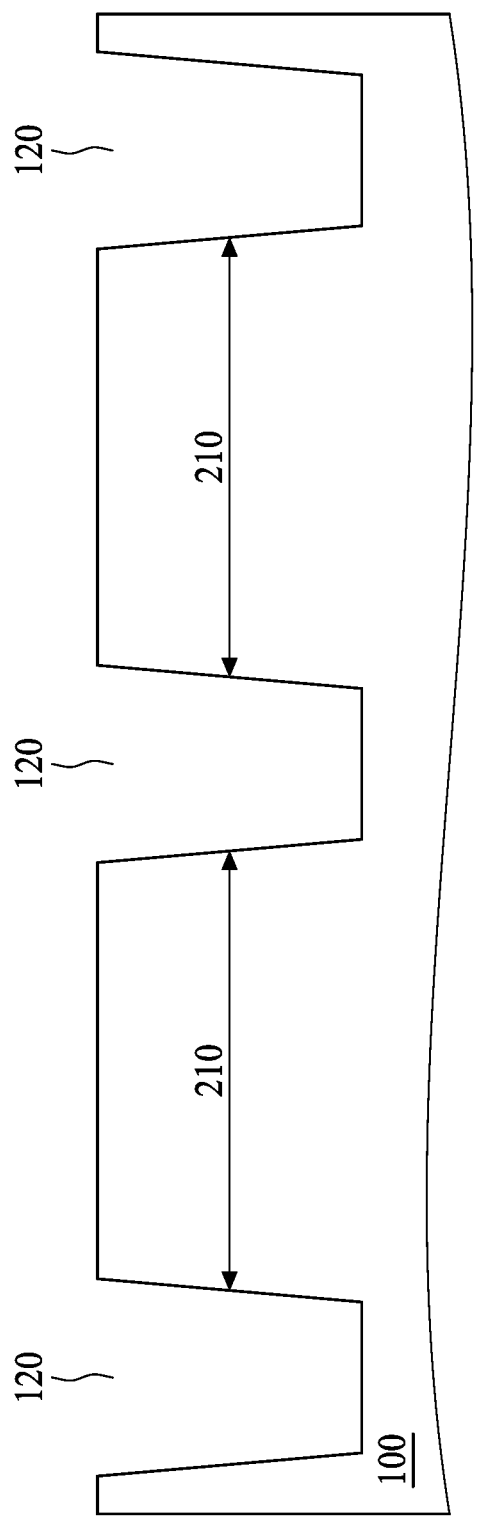
FIG. 8 is a cross-sectional view taken along a line B-B' in FIG. 7.

Referring to FIGS. 7 and 8, a plurality of second trenches 120 are formed in the semiconductor wafer 100 according to step S508 in FIG. 4. The cell region 102 of the semiconductor wafer 100 can comprise an active zone 106 and a dummy zone 108 adjacent to the active zone 106. As illustrated in FIG. 7, the dummy zone 108 is located between the active zone 106 and the peripheral region 104 of the semiconductor wafer 100. The second trenches 120 are formed in the active zone 106 of the semiconductor wafer 100 and extend in a second direction D2 intersecting the first direction D1. Therefore, after the formation of the second trenches 120, the semiconductor wafer 100 in the active zone 106 comprises a plurality of first islands 210. As illustrated in FIG. 7, each of the first islands 210 has a first longitudinal axis A1 parallel to the first direction D1. In addition, each of the first islands 210 has a first area. In some embodiments, the second trenches 120 can be formed by etching the semiconductor wafer 100 in the active zone 106 using a second trench pattern as a mask.

Figure 9:
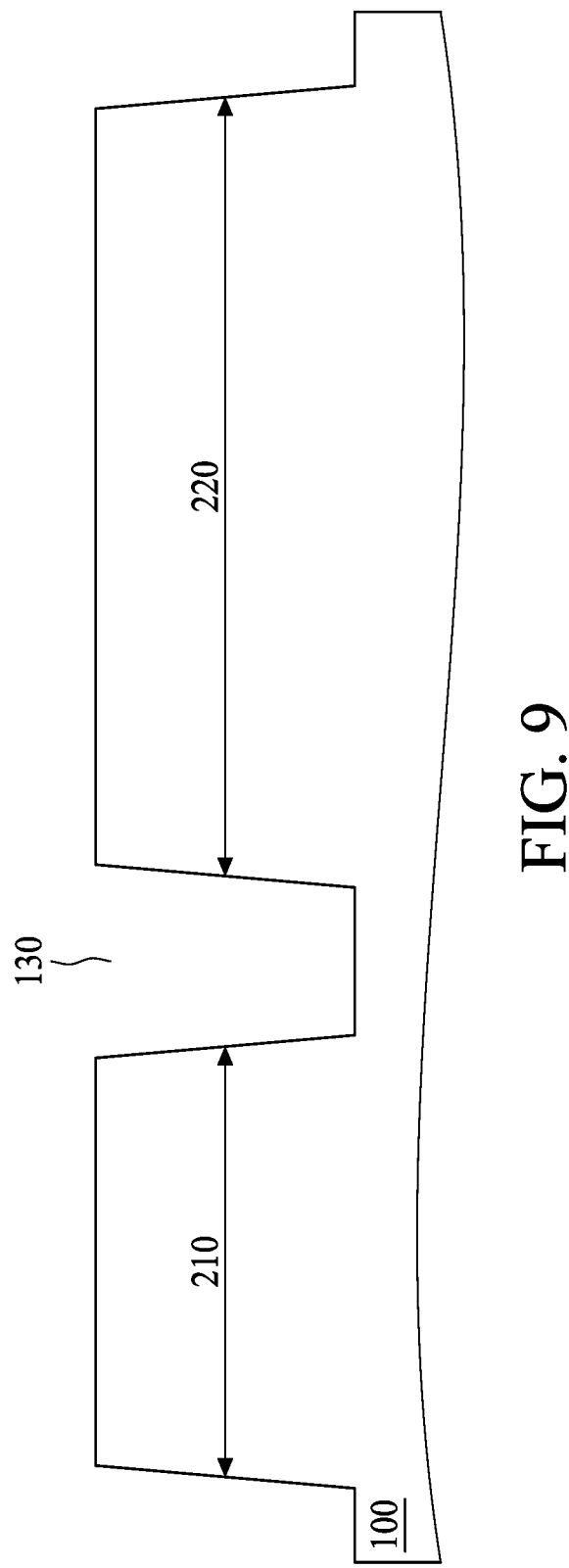
FIG. 9 is a cross-sectional view taken along a line C-C' in FIG. 7.

Referring to FIGS. 7 and 9, one or more third trenches 130 are formed in the semiconductor wafer 100 in the dummy zone 108 according to step S510 in FIG. 4. The third trenches 130 extend in the second direction D2, and a number of the third trenches 130 in the dummy zone 108 is less than a number of the second trenches 120 in the active zone 106. Therefore, after the formation of the third trenches 130, the dummy zone 108 comprises a plurality of second islands 220, and each of the second islands 220 has a second area greater than the first area. In some embodiments, the second area is at least two times larger than the first area. As illustrated in FIG. 7, the third trenches 130 in the dummy zone 108 connect to some of the second trenches 120 in the active zone 106, and each of the second islands 220 has a second longitudinal axis A2 parallel to the first direction D1. In other words, the second longitudinal axis A2 is parallel to the first longitudinal axis A1. In some embodiments, the third trenches 130 can be formed by etching the semiconductor wafer 100 in the dummy zone 108 using a third trench pattern as a mask.

Notably, the second trenches 120 and the third trenches 130 may be formed simultaneously in the semiconductor wafer 100 to reduce a number of steps in the fabrication process, thereby reducing fabrication costs and increasing quality and reliability. More particularly, the second trench pattern for the formation of the second trenches 120 in the active zone 106 and the third trench pattern for the formation of the third trenches 130 in the dummy zone 108 may be formed in an etching mask of photosensitive material or hardmask material on the semiconductor wafer 100, and then an etching process is performed to remove portions of the semiconductor wafer 100 exposed through the etching mask. In some embodiments, the first trench pattern, the second trench pattern and the third trench pattern may be formed in an etching mask, so that the first to third trenches 110 to 130 can be formed simultaneously.

Figure 10:
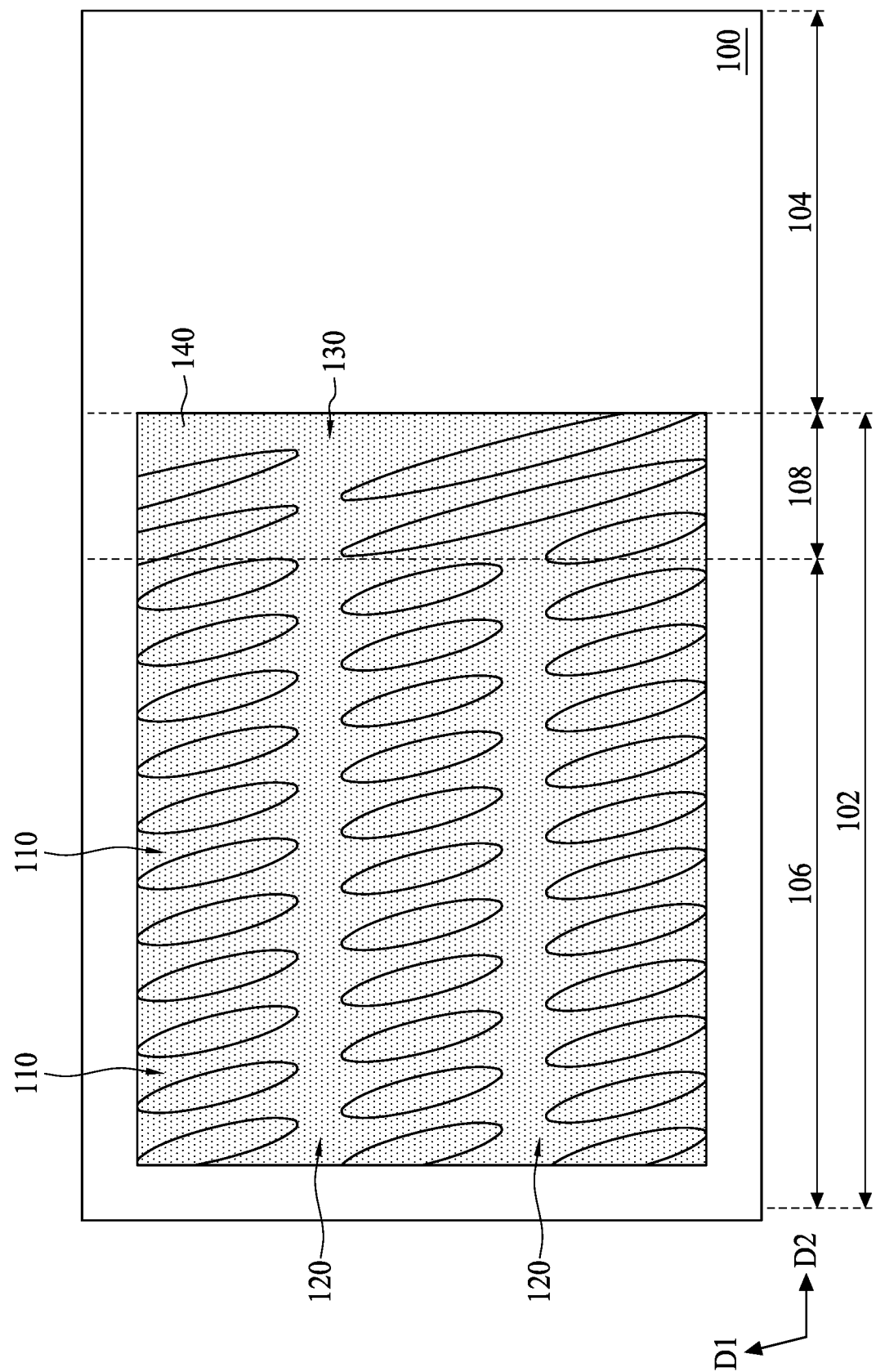
FIG. 10 is a plan view of an intermediate stage in the formation of the semiconductor device in accordance with some embodiments of the present disclosure.

Referring to FIG. 10, an isolation material 140 is deposited in the first trenches 110, the second trenches 120 and the third trenches 130 according to step S512 in FIG. 4. The isolation material 140 is made of dielectric material, such as silicon oxide. The isolation material 140 is deposited using a chemical vapor deposition (CVD) process such as a low-pressure CVD process or a plasma-enhanced CVD process, so that the isolation material 140 not only fills the first to third trenches 110 to 130, but also covers the semiconductor wafer 100.

Figure 11:
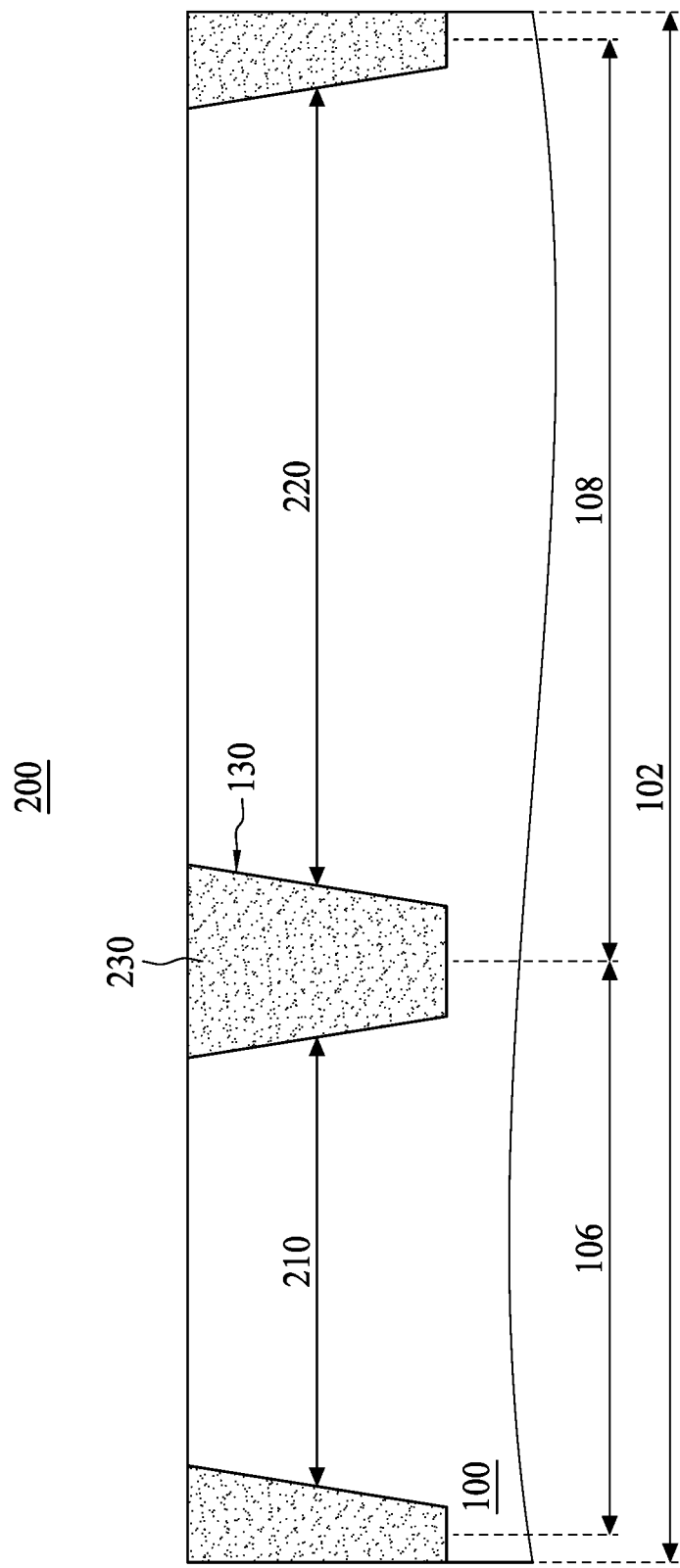
FIG. 11 is a cross-sectional view of an intermediate stage in the formation of the semiconductor device in accordance with some embodiments of the present disclosure.

After the isolation material 140 is deposited, a planarization process is optionally performed on the isolation material 140 using any suitable method, such as an etch-back process or a chemical mechanical polishing (CMP) process, for providing better topography. After the planarization process, a substrate 200 comprising the first islands 210 in the active zone 106, the second islands 220 in the dummy zone 108, and an isolation structure 230 disposed between the first and second islands 210 and 220 is formed, as shown in FIG. 11.

Figure 12:
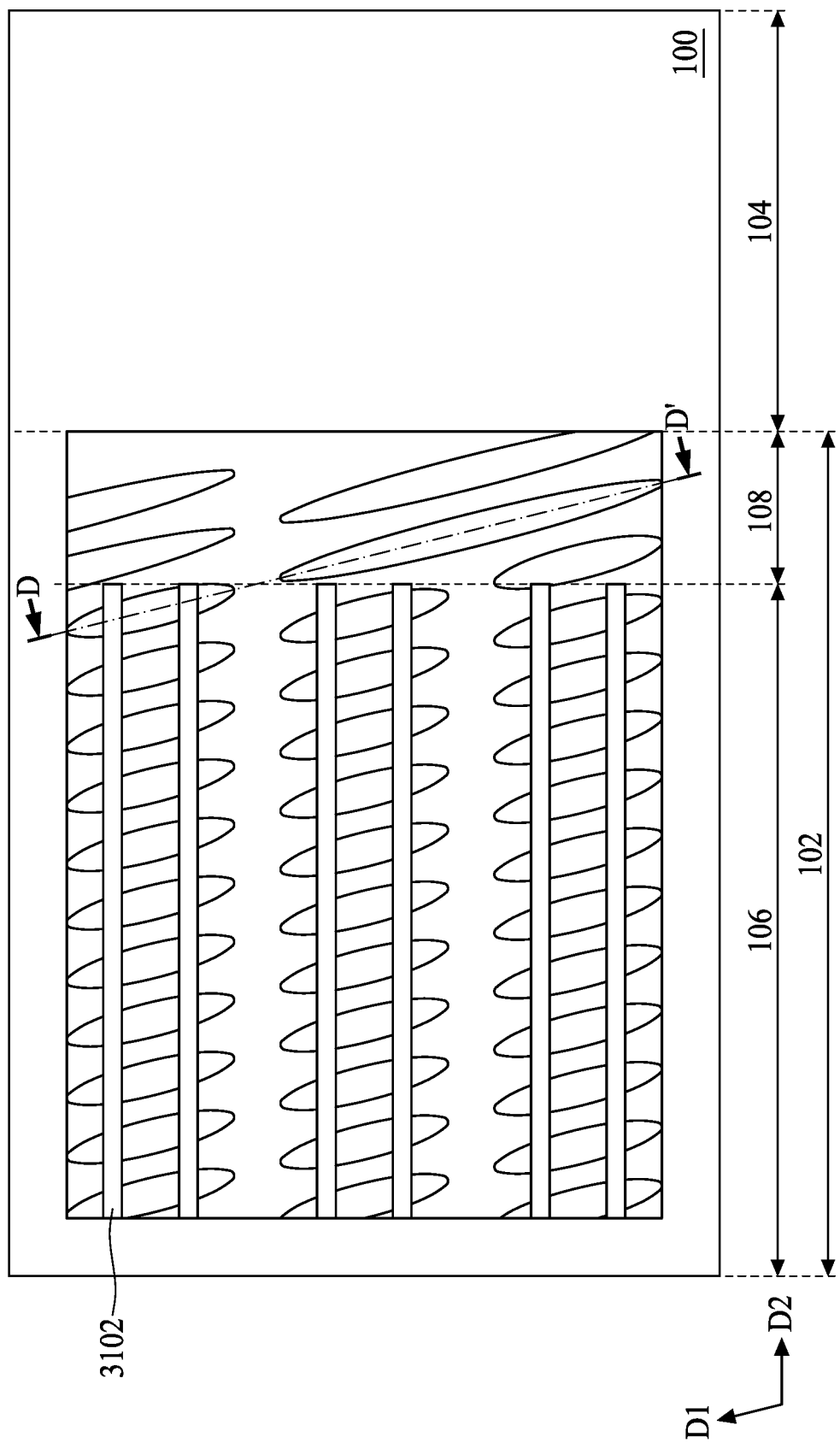
FIG. 12 is a plan view of an intermediate stage in the formation of the semiconductor device in accordance with some embodiments of the present disclosure.
Figure 13:
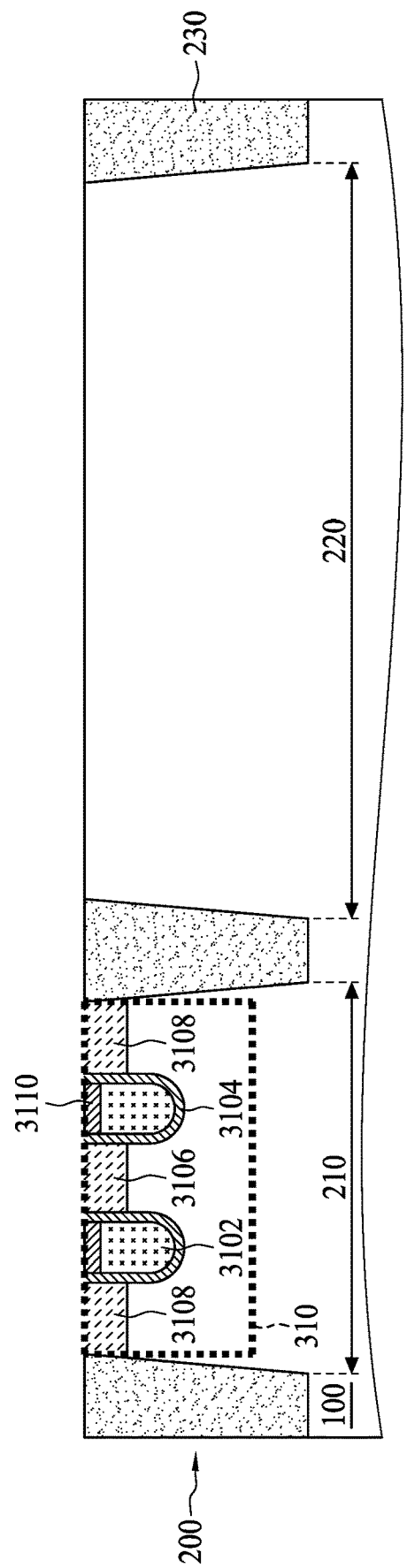
FIG. 13 is a cross-sectional view taken along a line D-D' in FIG. 12.

Referring to FIGS. 12 and 13, a plurality of access transistors 310 are formed in the substrate 200 in the active zone 106 according to step S514 in FIG. 4. The access transistors 310 include a plurality of word lines 3102, a plurality of gate insulators 3104, a first impurity region 3106 and a plurality of second impurity regions 3108. The word lines 3102 and the gate insulators 3104 are disposed in the substrate 200, wherein the gate insulators 3104 are disposed between the semiconductor wafer 100 and the word lines 3102. As illustrated in FIG. 12, the word lines 3102 extend longitudinally in the second direction D2 and across the first islands 210 and function as gates in the access transistors 310 through which they pass. The first impurity region 3106 and the second impurity regions 3108 are disposed between sides of the word lines 3102. The access transistors 310 may further include a passivation layer 3110 disposed in the substrate 200 and used to cap the word lines 3102 and the gate insulators 3104.

Figure 14:
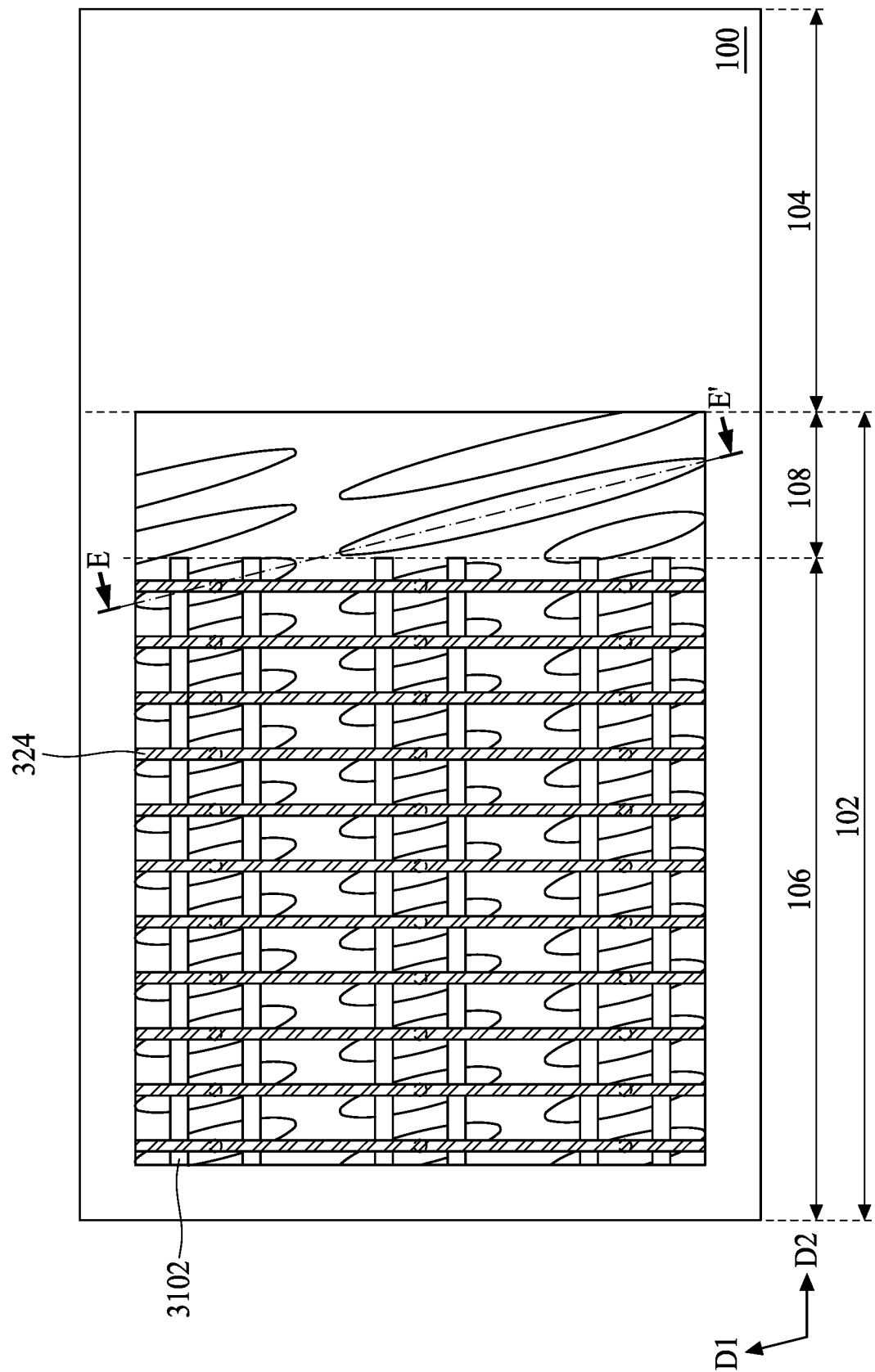
FIG. 14 is a plan view of an intermediate stage in the formation of the semiconductor device in accordance with some embodiments of the present disclosure.
Figure 15:
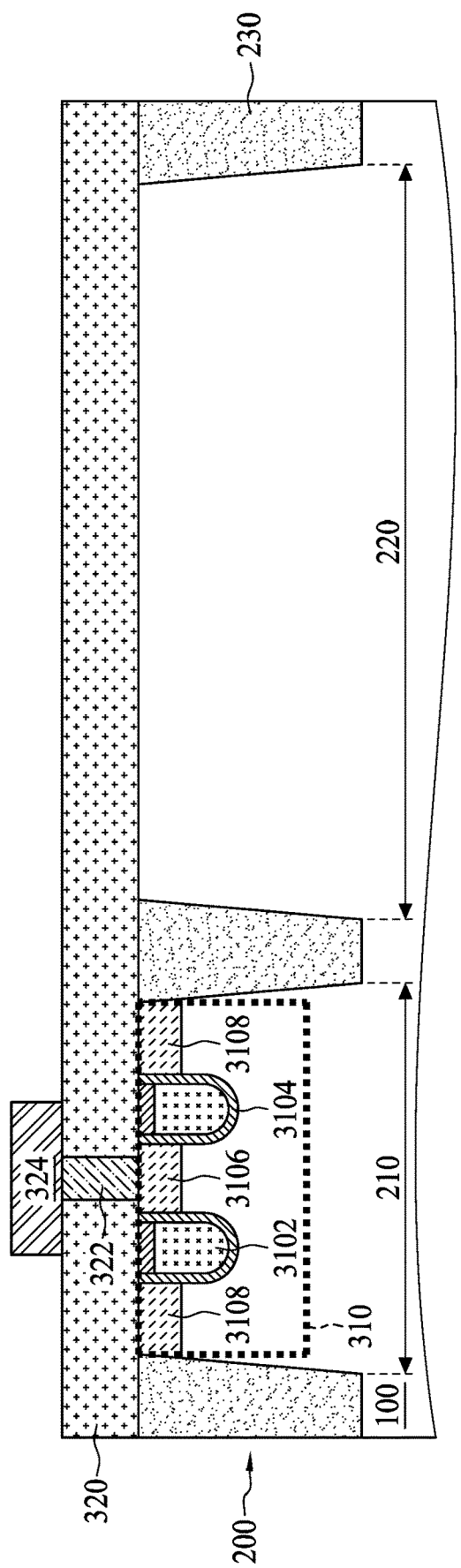
FIG. 15 is a cross-sectional view taken along a line E-E' in FIG. 14.

Referring to FIGS. 14 and 15, a plurality of bitline contacts 322 are formed in a first insulative layer 320 covering the substrate 200 and the access transistor 310 and a plurality of bitlines 324 are formed in contact with the bitline contacts 322 according to a step S516 in FIG. 4. The first insulative layer 320 is deposited on the substrate 200 and the access transistors 310 using a CVD process. In some embodiments, the first insulative layer 320 may include oxide, tetraethylorthosilicate (TEOS), undoped silicate glass (USG), phosphosilicate glass (PSG), borosilicate glass (BSG), borophosphosilicate glass (BPSG), fluoride silicate glass (FSG), spin-on glass (SOG), tonen silazene (TOSZ), or combinations thereof. After the deposition, the first insulative layer 320 may be planarized, using, for example, a CMP process, to yield an acceptably flat topology.

The bitline contacts 322 penetrating through the first insulative layer 320 are formed using a damascene process. The bitline contacts 322 may include doped polysilicon. The bitlines 324 are in contact with the bitline contacts 322. The bitlines 324 may be formed by depositing a conductive material to bury the first dielectric layer 320 and the bitline contact 322 and patterning the conductive material with a bitline pattern, using an anisotropic etching process, for example.

Figure 16:
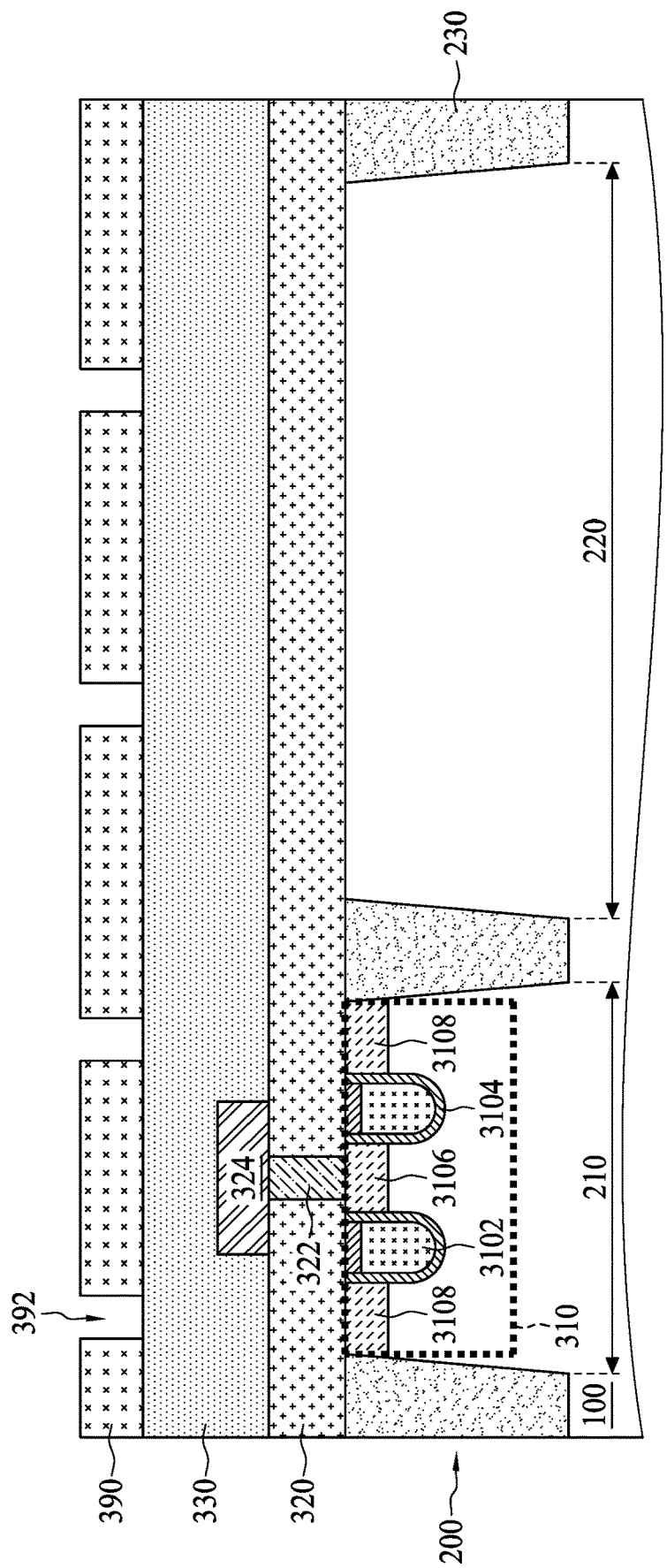
FIGS. 16 to 21 illustrate cross-sectional views of intermediate stages in the formation of the semiconductor device in accordance with some embodiments of the present disclosure.

Referring to FIG. 16, a second insulative layer 330 and a pattern mask 390 are sequentially formed on the first insulative layer 320 and the bitlines 324 according to step S518 in FIG. 4. The second insulative layer 330, including dielectric material, can be formed by uniformly depositing a dielectric material using a CVD process or a spin-coating process. The second insulative layer 330 may be planarized, using, for example, a CMP process, to yield an acceptably flat topology. In some embodiments, the second insulative layer 330 is for protecting the bitlines 324, and may include dielectric material, such as TEOS.

The pattern mask 390 includes a plurality of windows 392 to expose portions of the second insulative layer 330. As illustrated in FIG. 16, the windows 392 are disposed above the second impurity regions 3108 and the second islands 220. The pattern mask 390 can be a photoresist mask or a hard mask. The pattern mask 390 includes photosensitive material, and can be formed by performing at least one exposure process and at least one develop process on the photosensitive material that fully covers the second insulative layer 330, wherein the photosensitive material may be applied on the second insulative layer 330 by a spin-coating process and then dried using a soft-baking process. Alternatively, the pattern mask 390 is a hard mask, and can be made of polysilicon, carbon, inorganic materials (such as nitride) or other suitable materials.

Figure 17:
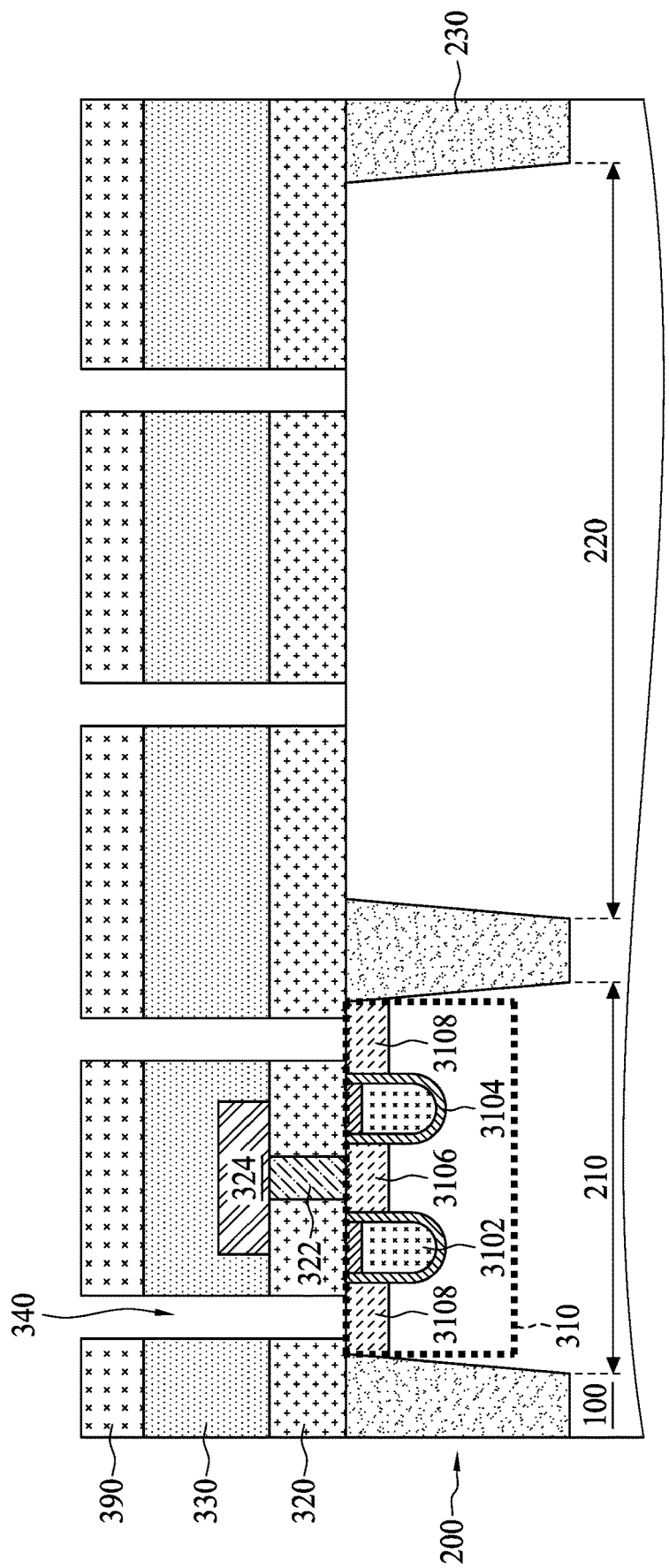

Referring to FIG. 17, one or more etching processes are performed to remove portions of the first and second insulative layers 320 and 330 exposed through the pattern mask 390 according to step S520 in FIG. 4. Consequently, a plurality of openings 340 are formed. As illustrated in FIG. 17, the openings 340 penetrate through the first and second insulative layers 320 and 330, and portions of the second impurity regions 3108 in the active zone 106 and portions of the second islands 220 are exposed through the openings 340. The first and second insulative layers 320 and 330 are etched using different etching processes. Alternatively, the first and second insulative layers 320 and 330 may be etched using an etching step utilizing multiple etchants, selected based on the materials of the first insulative layer 320 and the second insulative layer 330, to sequentially etch the second insulative layer 330 and the first insulative layer 320.

After the formation of the openings 340, the pattern mask 390 is removed using a suitable process. The pattern mask 390 that includes photosensitive material is removed using an ashing process or a wet strip process, wherein the wet strip process may chemically alter the pattern mask 390 so that it no longer adheres to the second insulative layer 330. The pattern mask 390 which is a hard mask is removed using a wet etching process.

Figure 18:
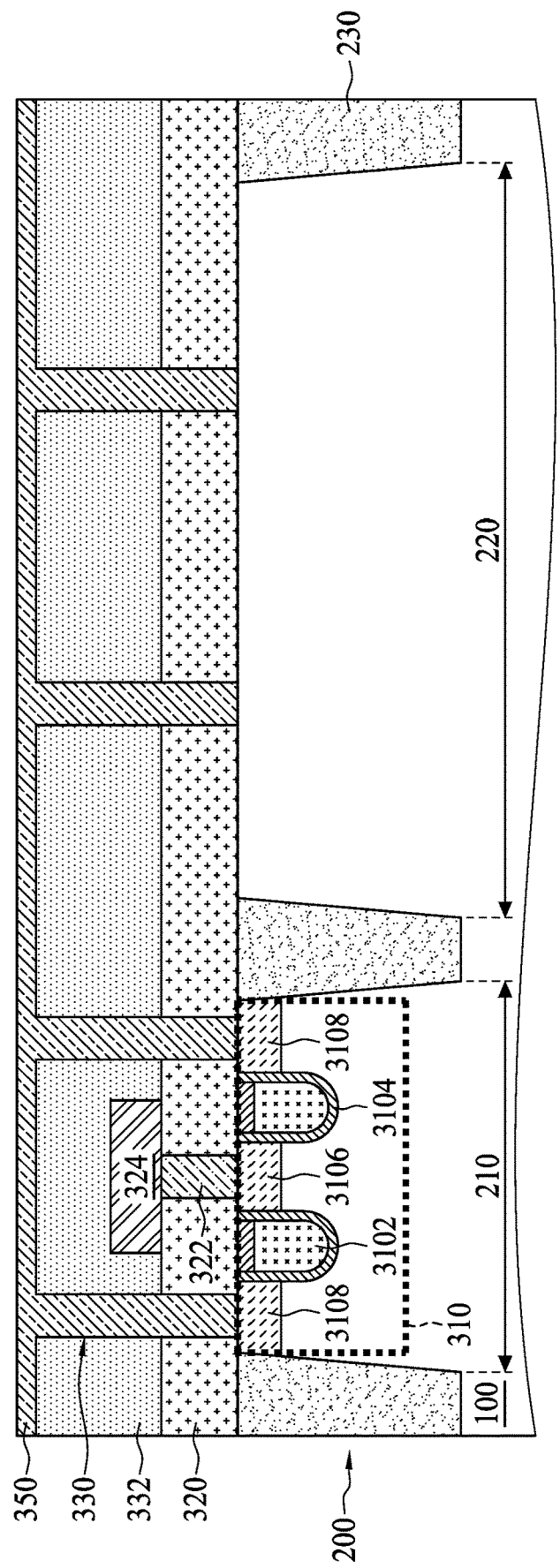

Referring to FIG. 18, a first conductive material 350 is deposited in the openings 340 according to step S522 in FIG. 4. The first conductive material 350 is uniformly deposited on the second insulative layer 330, the second impurity regions 3108 and the second islands 220 until the openings 340 are entirely filled. The first conductive material 350 may be, for example, doped polysilicon. The first conductive material 350 is deposited using a plating process or a CVD process.

Figure 19:
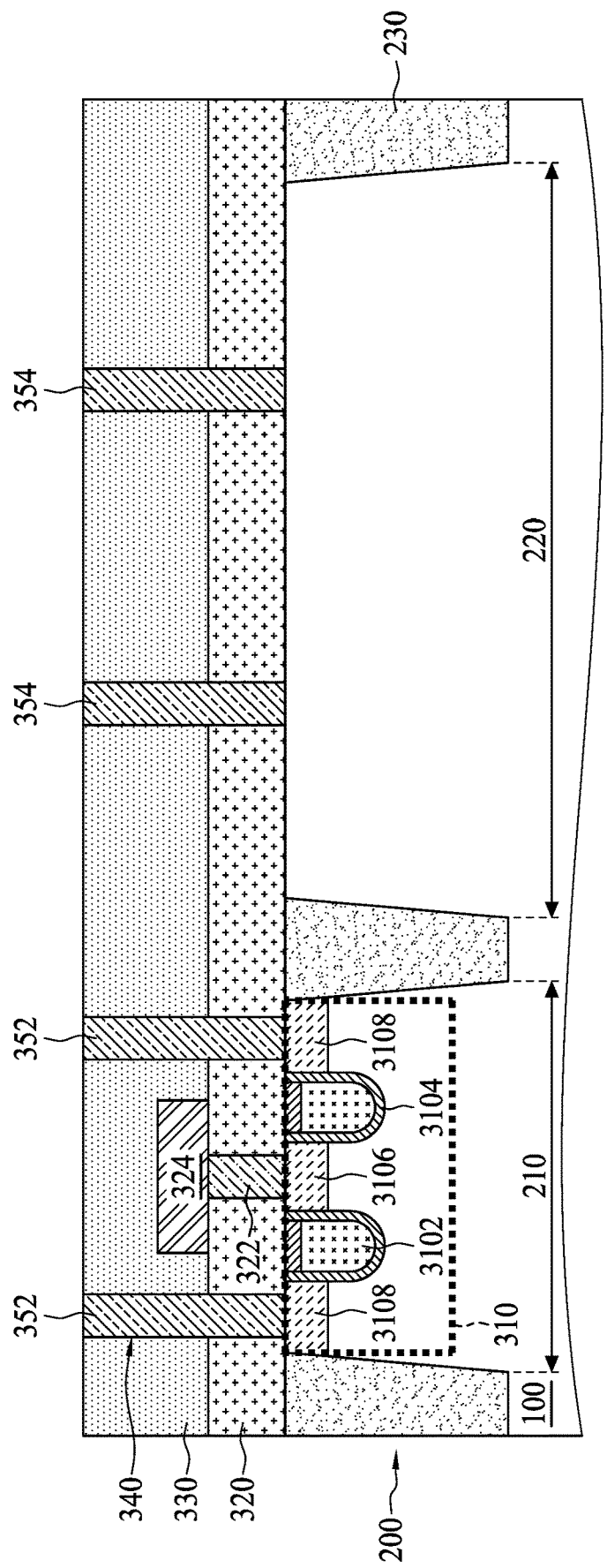

Next, the method 500 proceeds to step S524, in which a planarizing process is performed to remove the first conductive material 350 above the openings 340. Consequently, a plurality of storage node contacts 352 in the active zone 106 and a plurality of conductive features 354 in the dummy zone 108 are formed, as shown in FIG. 19. After the removal of the superfluous first conductive material 350, the second insulative layer 330 is exposed.

Figure 20:
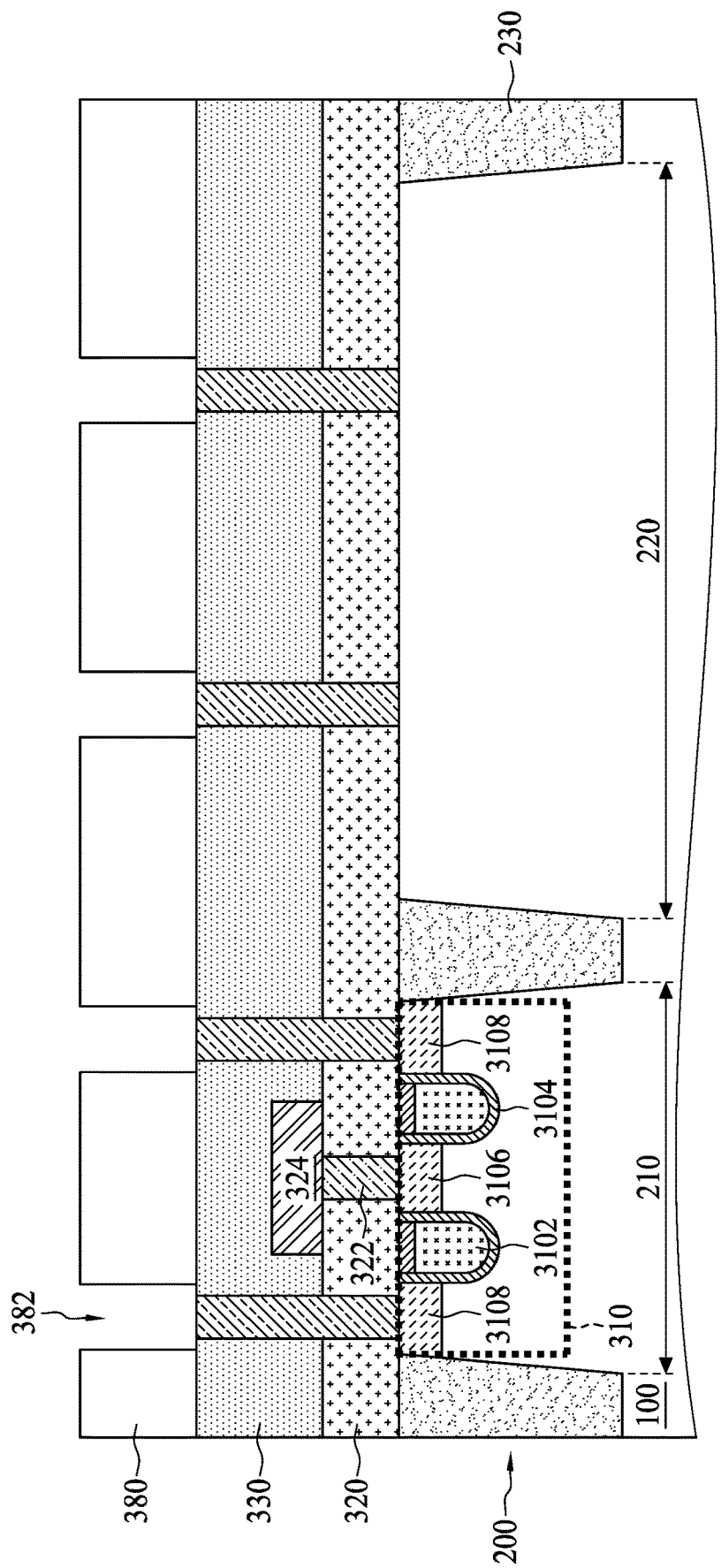

Referring to FIG. 20, a patterned sacrificial layer 380 is formed on the second insulative layer 330 according to step S526 in FIG. 4. The patterned sacrificial layer 380 includes a plurality of fourth trenches 382 to expose the storage node contacts 352 and the conductive features 354. The patterned sacrificial layer 380 may include dielectric material that is different from a material of the second insulating layer 330. In some embodiments, the patterned sacrificial layer 380 includes silicon oxide or silicon nitride.

Figure 21:
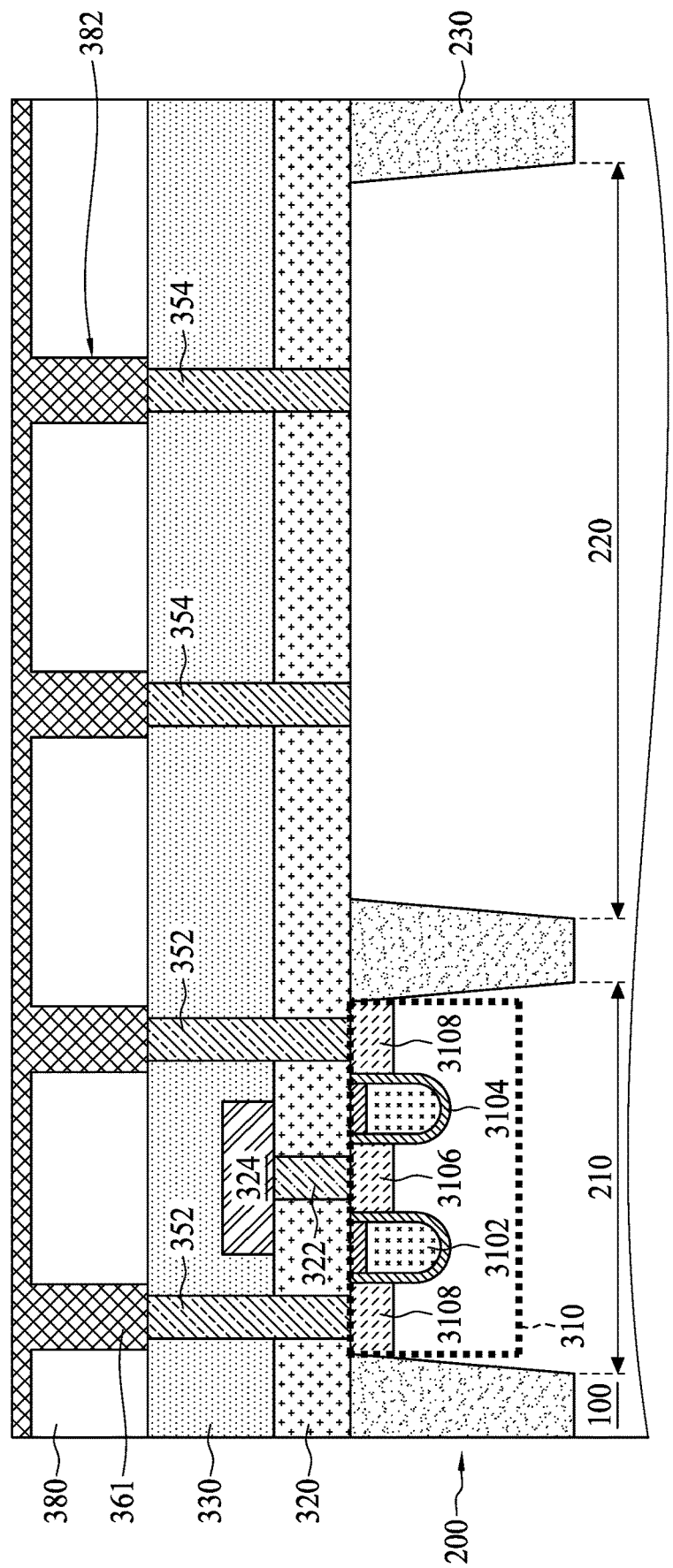

Referring to FIG. 21, the fourth trenches 382 are filled with a second conductive material 361 utilizing a deposition process according to step S528 in FIG. 4. The second conductive material 361 can be deposited using, for example, a low-pressure CVD process. The second conductive material 361 is uniformly deposited on the storage node contacts 352, the conductive features 354 and the patterned sacrificial layer 380 until the fourth trenches 382 are entirely filled. The second conductive material 361 may be formed of doped polysilicon or metal such as titanium nitride (TiN) or ruthenium (Ru).

Figure 22:
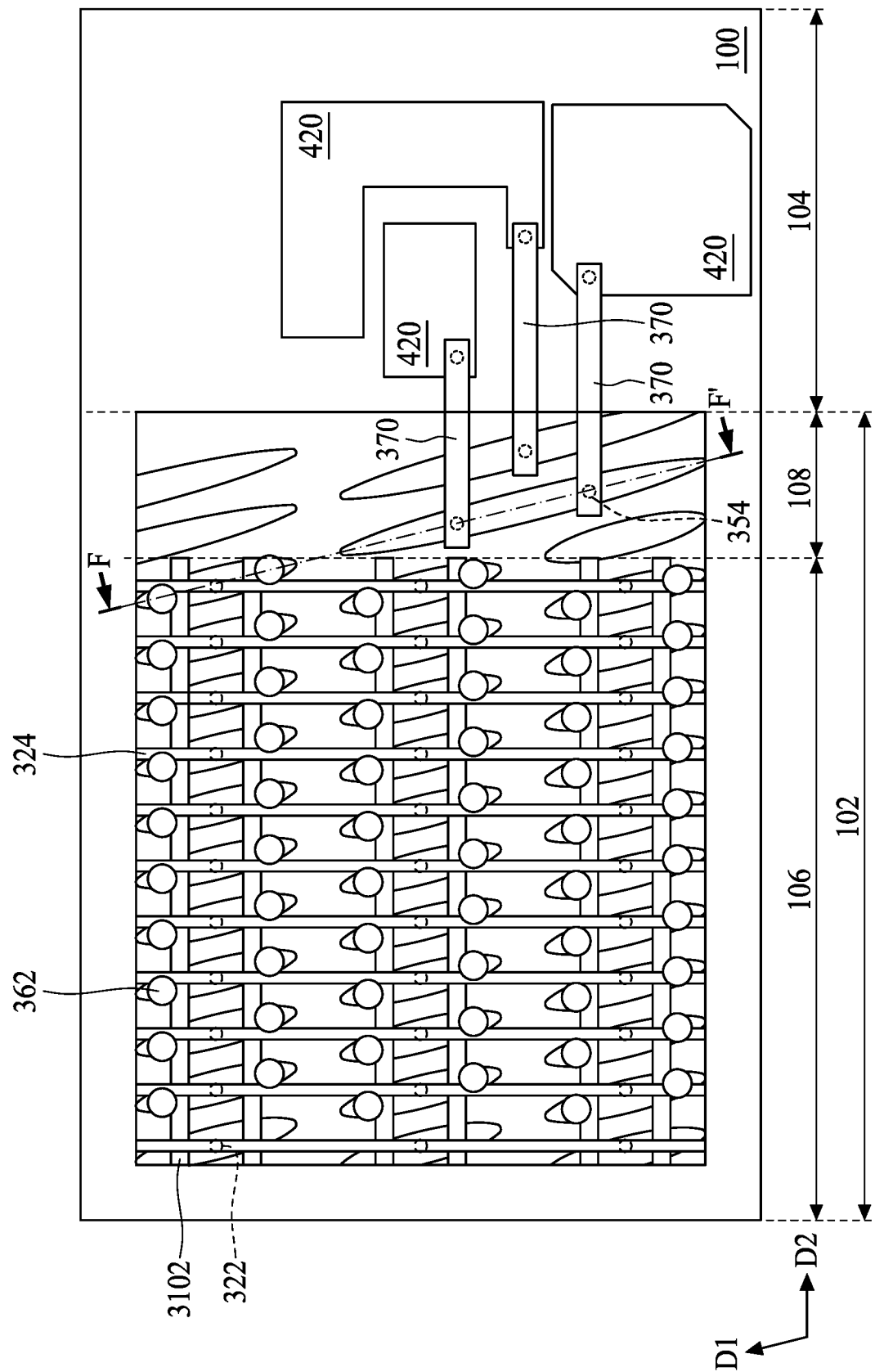
FIG. 22 is a plan view of an intermediate stage in the formation of the semiconductor device in accordance with some embodiments of the present disclosure.
Figure 23:
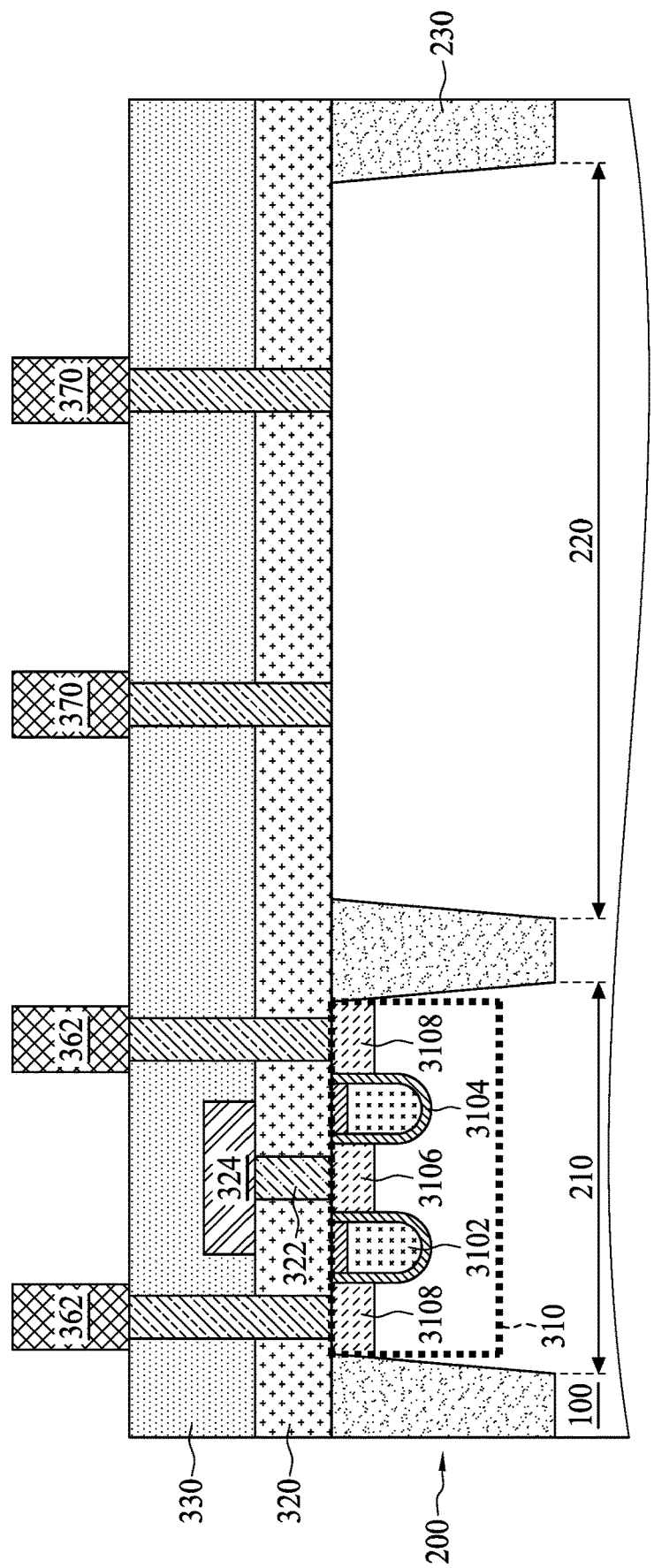
FIG. 23 is a cross-sectional view taken along a line F-F' in FIG. 22.

After the deposition of the second conductive material 361, one or more removal processes are performed according to step S530 in FIG. 4 to remove the second conductive material 361 overflowing the fourth trenches 382 and the patterned sacrificial layer 380. Consequently, a plurality of lower electrodes 362 in the active zone 106 and a plurality of conductive lines 370 in the dummy zone 108, as shown in FIGS. 22 and 23, are formed. After the removal of the superfluous second conductive material 361 and the patterned sacrificial layer 380, the second insulative layer 330 is exposed.

Figure 24:
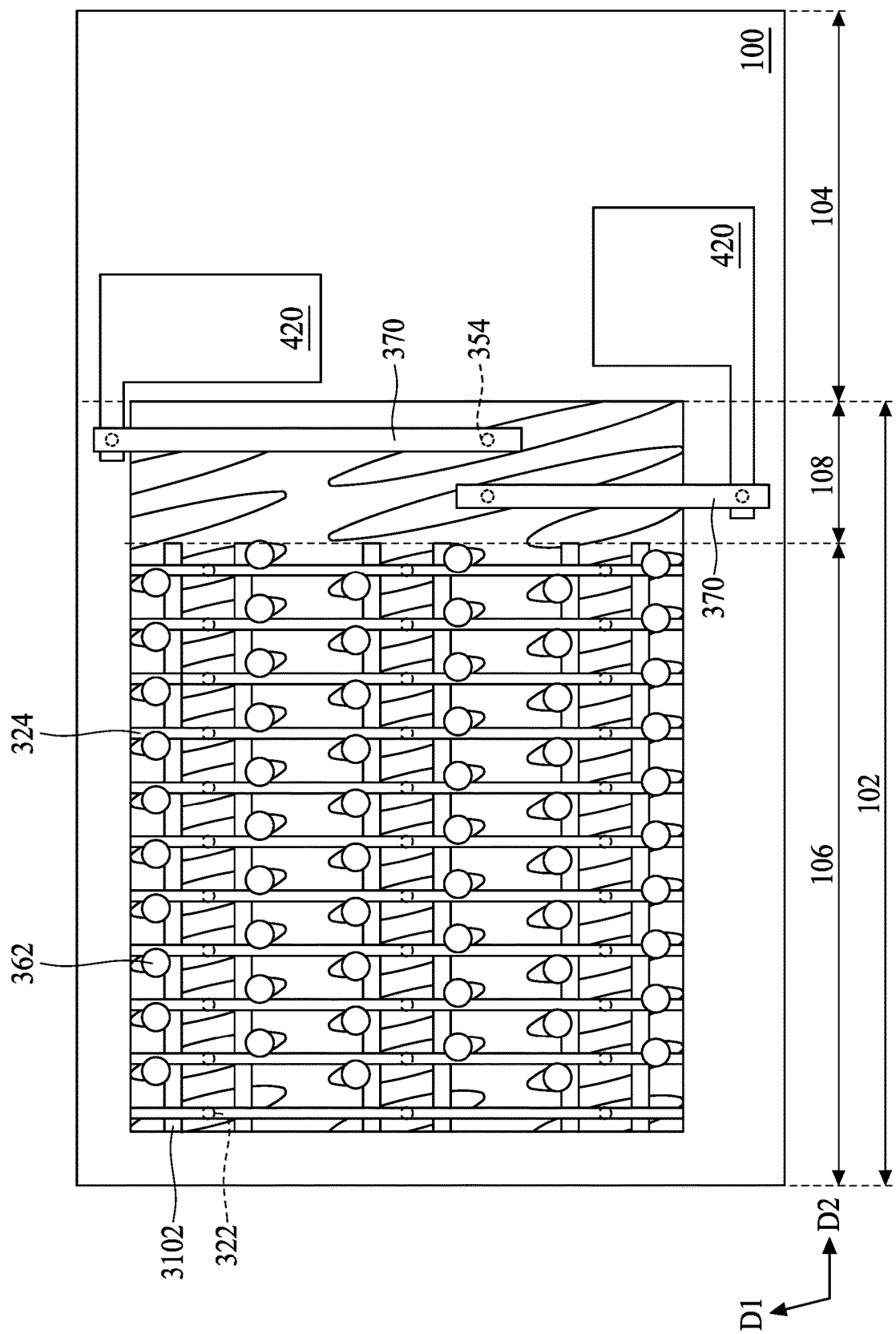
FIGS. 24 and 25 are plan views of intermediate stages in the formation of the semiconductor device in accordance with some embodiments of the present disclosure.
Figure 25:
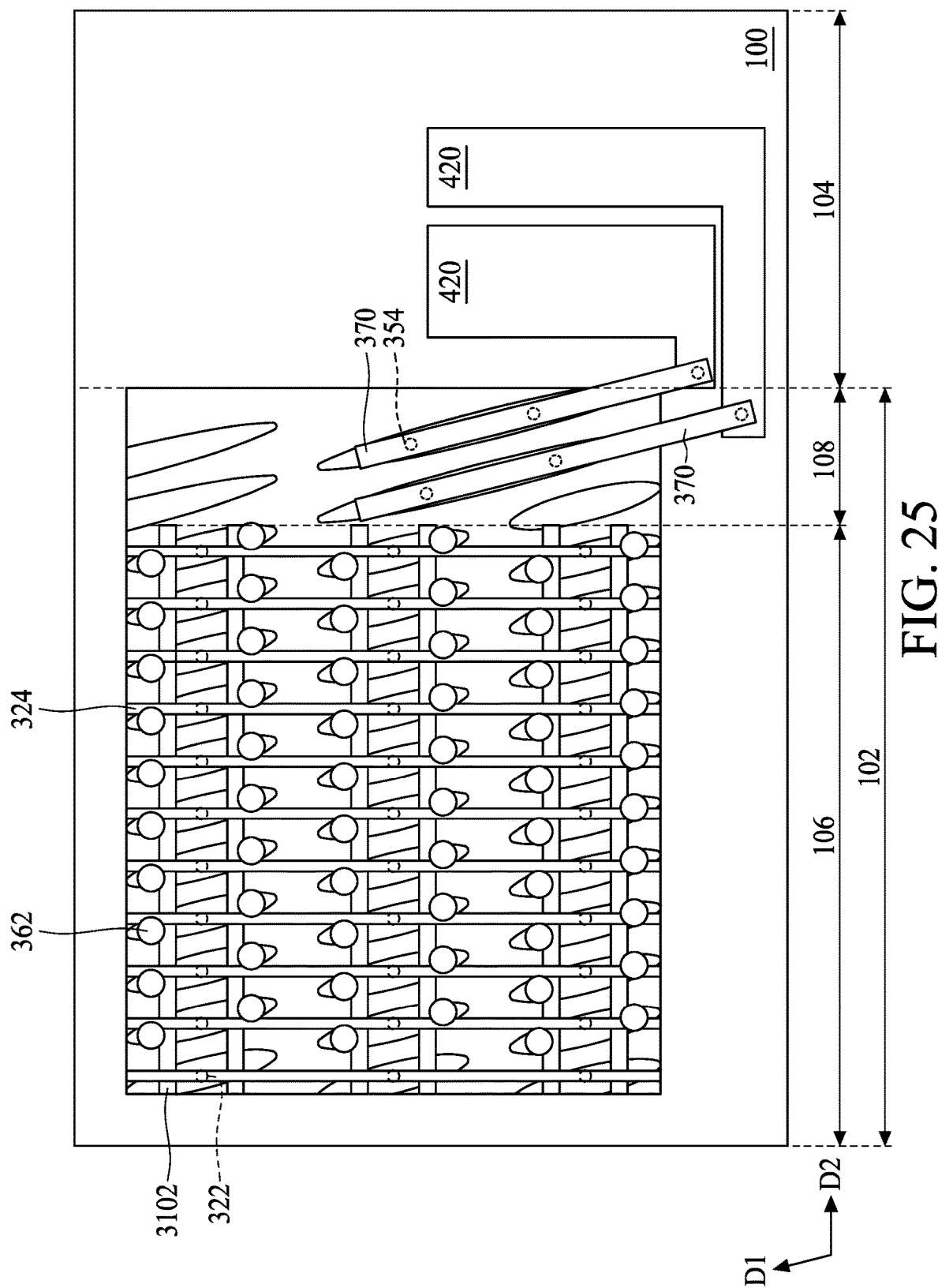

As illustrated in FIG. 22, the conductive lines 370 extend in the second direction D2 intersecting the first longitudinal axis A1 (shown in FIG. 7) at an angle less than 90 degrees. The conductive lines 370 and the word lines 3102 can extend in a same direction; however, in alternative embodiments, the conductive lines 370 and the bitlines 324 may extend in a same direction, as shown in FIG. 24. Alternatively, the conductive lines 370 may extend along the first longitudinal axis A1, as shown in FIG. 25.

Figure 26:
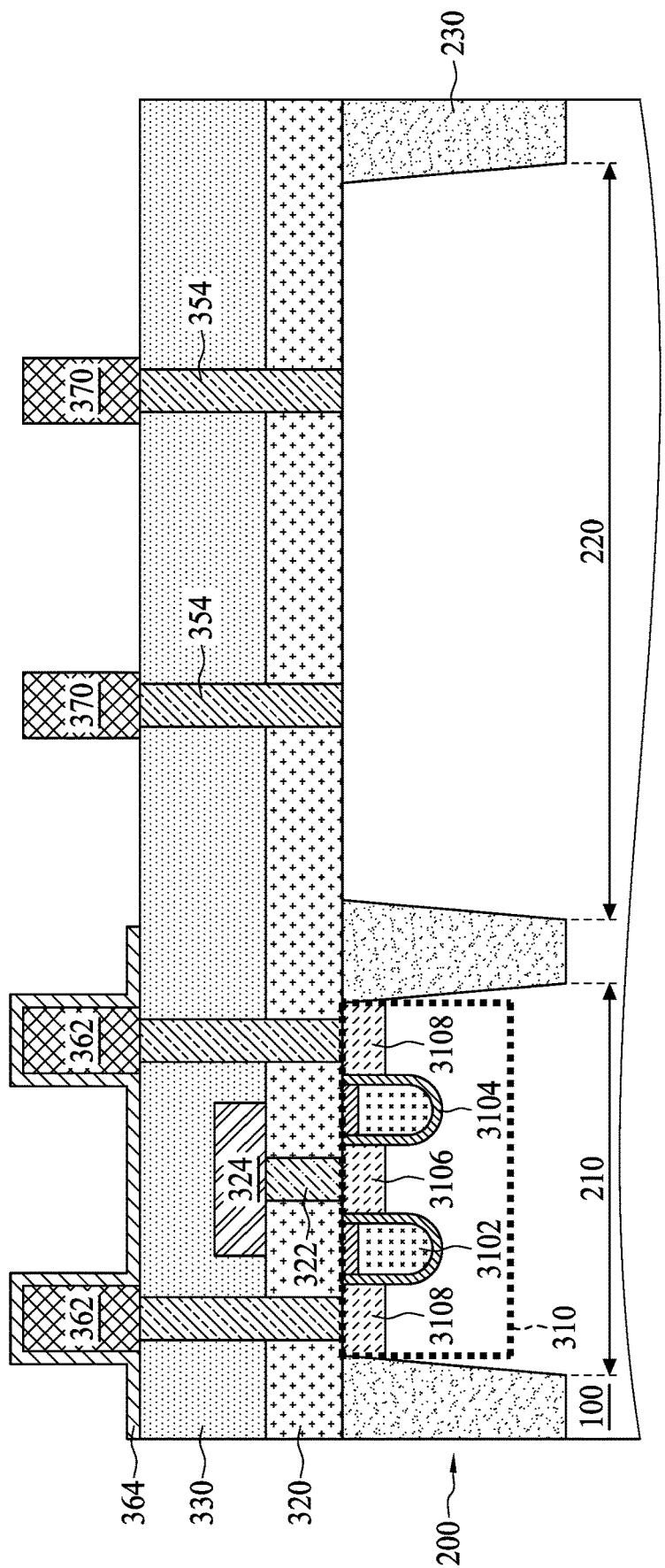
FIG. 26 illustrates a cross-sectional view of an intermediate stage in the formation of the semiconductor device in accordance with some embodiments of the present disclosure.

Referring to FIG. 26, a capacitor insulator 364 is deposited on the lower electrode 362 according to step S532. The capacitor insulator 364 can have a topology following a topology of the lower electrodes 362 and the second dielectric layer 330. The capacitor insulator 364 may include silicon dioxide ($SiO_2$), silicon nitride ($Si_3N_4$), or high-k materials such as zirconium oxide ($Zr_2O_2$), hafnium oxide ($HfO_2$), titanium oxide ($TiO_2$), or aluminum oxide ($Al_2O_2$). In some embodiments, the capacitor insulator 364 may be formed of either a double film of nitride/oxide film or a triple film of oxide/nitride/oxide. The upper electrode 366 may be a substantially conformal layer and may be formed by a CVD process.

Next, the method 500 proceeds to step S534, in which an upper electrode 366 is formed on the capacitor insulator 364. Consequently, the semiconductor device 10 shown in FIG. 2 is formed. The upper electrode 366 may be a substantially conformal layer and may be formed by a CVD process. The upper electrode 366 may be formed of low-resistivity material, such as titanium nitride or combinations of titanium nitride, tantalum nitride (TaN), tungsten nitride (WN), ruthenium, iridium (Ir), and platinum (Pt).

In conclusion, by forming the programmable resistors necessary for the peripheral circuits 420 in the dummy zone 108 located between the active zone 106 and the peripheral region 104 of the substrate 200 simultaneously with the formation of the first islands 210, a number of processing steps necessary for fabrication of the entire device can be minimized.

One aspect of the present disclosure provides a semiconductor device. The semiconductor device comprises a substrate, an access transistor, a storage capacitor, a storage node contact, a conductive line and a conductive feature. The substrate includes a first island, a second island and an isolation structure disposed between the first island and the second island, wherein the first island has a first area, and the second island has a second area greater than the first area. The access transistor is disposed in or on the first island. The storage capacitor is disposed over the access transistor. The storage node contact connects the storage capacitor to the access transistor. The conductive line is disposed over the substrate. The conductive feature connects the conductive line to the second island, and the conductive feature and the storage node contact are disposed at a same horizontal level.

One aspect of the present disclosure provides a semiconductor device. The semiconductor device comprises a semiconductor wafer, a memory cell, a peripheral circuit and a resistive circuit. The semiconductor wafer includes a cell region and a peripheral region adjacent to the cell region, and the cell region comprises an active zone and a dummy zone adjacent to the active zone. The dummy zone is located between the active zone and the peripheral region. The memory cell is located in the active zone and comprises an access transistor, a storage capacitor and a storage node contact. The access transistor is disposed in or on the semiconductor wafer, the storage capacitor is disposed over the access transistor, and the storage node contact connects the storage capacitor to the access transistor. The peripheral circuit is located in the peripheral region, and the resistive circuit is located in the dummy zone. The resistive circuit includes a conductive feature in contact with the semiconductor wafer, wherein the storage node contact and the conductive feature are located at a same horizontal level over the semiconductor wafer.

One aspect of the present disclosure provides a method of manufacturing a semiconductor device. The method includes steps of forming a substrate comprising a first island and a second island, wherein the first island has a first area, and the second island has a second area greater than the first area; depositing an insulative layer to cover the substrate; forming a storage node contact and a conductive feature penetrating through the insulative layer, wherein the storage node contact is in contact with the first island and the conductive feature is in contact with the second island; and forming a conductive line on the insulative layer and connected to the conductive feature.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A semiconductor device, comprising:
    a substrate comprising a first island, a second island and an isolation structure disposed between the first island and the second island, wherein the first island has a first area, and the second island has a second area greater than the first area;
    an access transistor disposed in or on the first island;
    a storage capacitor disposed over the access transistor;
    a storage node contact connecting the storage capacitor to the access transistor;
    a conductive line disposed over the substrate; and
    a conductive feature connecting the conductive line to the second island,
    wherein a top surface of the conductive feature and a top surface of the storage node contact are disposed at a same horizontal level.

2. The semiconductor device of claim 1, wherein the second island is closer to a periphery of the substrate than the first island.

3. The semiconductor device of claim 1, wherein the second area is at least two times larger than the first area.

4. The semiconductor device of claim 1, wherein the storage capacitor comprises:
a lower electrode in contact with the storage node contact;
a capacitor insulator over the lower electrode; and
an upper electrode over the capacitor insulator,
wherein a top surface of the lower electrode and a top surface of the conductive line are disposed at a same horizontal level.

5. The semiconductor device of claim 1, wherein the first island has a first longitudinal axis, and the second island has a second longitudinal axis parallel to the first longitudinal axis.

6. The semiconductor device of claim 5, wherein a length of the conductive line extends along the first longitudinal axis.

7. The semiconductor device of claim 1, further comprising an insulative layer disposed between the access transistor and the storage capacitor and between the conductive line and the second island.

8. The semiconductor device of claim 7, wherein the storage node contact penetrates through the insulative layer.

9. The semiconductor device of claim 1, wherein the substrate comprises an active zone and a dummy zone adjacent to the active zone, the first island is located in the active zone, and the second island is located in the dummy zone.

10. The semiconductor device of claim 9, further comprising a plurality of peripheral circuits located in a peripheral region of the substrate, wherein the dummy zone is located between the active zone and the peripheral region, and the second island functionally acts as a programmable resistor and is electrically coupled to at least one of the peripheral circuits through the conductive feature and the conductive line.

11. A semiconductor device, comprising:
a semiconductor wafer comprising a cell region and a peripheral region adjacent to the cell region, wherein the cell region comprises an active zone and a dummy zone adjacent to the active zone, and the dummy zone is located between the active zone and the peripheral region;
a memory cell located in the active zone and comprising an access transistor disposed in or on the semiconductor wafer, a storage capacitor disposed over the access transistor, and a storage node contact connecting the storage capacitor to the access transistor;
a peripheral circuit located in the peripheral region; and
a resistive circuit located in the dummy zone and comprising a conductive feature in contact with the semiconductor wafer, wherein a top surface of the storage node contact and a top surface of the conductive feature are located at a same horizontal level over the semiconductor wafer.

12. The semiconductor device of claim 11, further comprising an isolation structure disposed in the semiconductor wafer to define a first island in the active zone and a second island in the dummy zone, wherein the first island has a first area, and the second island has a second area greater than the first area.

13. The semiconductor device of claim 12, wherein the resistive circuit comprising the second island and the conductive feature is electrically connected to the peripheral circuit through a conductive line disposed over the semiconductor wafer.

14. The semiconductor device of claim 13, wherein a length of the conductive line extends in a first direction, and a width of each of the first island and the second island extends in a second direction different from the first direction.

15. The semiconductor device of claim 13, further comprising a length of a bitline extending parallel to a length of the conductive line and configured to electrically connect the access transistor to the peripheral circuit.

* * * * *